United States Patent
Lee

(10) Patent No.: US 8,399,904 B2
(45) Date of Patent: Mar. 19, 2013

(54) LIGHT EMITTING DEVICE AND LIGHTING SYSTEM HAVING THE SAME

(75) Inventor: GunKyo Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/206,304

(22) Filed: Aug. 9, 2011

(65) Prior Publication Data

US 2011/0309405 A1 Dec. 22, 2011

(30) Foreign Application Priority Data

Aug. 9, 2010 (KR) .................. 10-2010-0076465

(51) Int. Cl.
*H01L 33/00* (2010.01)
(52) U.S. Cl. .................. 257/99; 257/E33.066
(58) Field of Classification Search .............. 257/99, 257/79, 98, E33.001, E33.062, E33.057, 257/E33.058, E33.059, E33.06, E23.061, 257/768, E23.001, E21.499, E33.066; 438/29, 438/106, 28
See application file for complete search history.

(56) References Cited

U.S. PATENT DOCUMENTS

| | | | | |
|---|---|---|---|---|
| 3,746,853 | A * | 7/1973 | Kosman et al. ............ | 362/301 |
| 7,939,848 | B2 * | 5/2011 | Kim et al. .................. | 257/99 |
| 2003/0170922 | A1 | 9/2003 | Sakamoto et al. | |
| 2005/0051792 | A1 | 3/2005 | Sasuga | |
| 2005/0110123 | A1 * | 5/2005 | Waitl et al. ................ | 257/678 |
| 2005/0116235 | A1 | 6/2005 | Schultz et al. | |
| 2006/0011928 | A1 | 1/2006 | Sorg et al. | |
| 2006/0208269 | A1 | 9/2006 | Kim et al. | |
| 2007/0080357 | A1 | 4/2007 | Ishii | |
| 2007/0145403 | A1 * | 6/2007 | Tomioka et al. ........... | 257/99 |
| 2007/0187705 | A1 | 8/2007 | Tanaka et al. | |
| 2008/0224161 | A1 | 9/2008 | Takada | |
| 2008/0225532 | A1 * | 9/2008 | Kokubu et al. ............ | 362/368 |
| 2009/0206358 | A1 | 8/2009 | Chen et al. | |
| 2009/0224271 | A1 * | 9/2009 | Seo et al. .................. | 257/98 |
| 2009/0283784 | A1 * | 11/2009 | Chang ....................... | 257/98 |
| 2010/0290233 | A1 * | 11/2010 | Okazaki ..................... | 362/311.01 |
| 2011/0127566 | A1 * | 6/2011 | Yoon .......................... | 257/99 |
| 2011/0141729 | A1 * | 6/2011 | Yang et al. ................ | 362/235 |
| 2011/0175119 | A1 * | 7/2011 | Kim et al. .................. | 257/91 |
| 2011/0284900 | A1 * | 11/2011 | Kim ............................ | 257/98 |
| 2011/0303941 | A1 * | 12/2011 | Lee ............................ | 257/98 |

FOREIGN PATENT DOCUMENTS

| | | | |
|---|---|---|---|
| EP | 2109157 | A1 * | 10/2009 |
| JP | 64-47035 | A | 2/1989 |
| JP | 11-40858 | A | 2/1999 |
| JP | 2000-77725 | A | 3/2000 |

(Continued)

*Primary Examiner* — Matthew Landau
*Assistant Examiner* — Latanya N Crawford
(74) *Attorney, Agent, or Firm* — Birch, Stewart, Kolasch & Birch, LLP

(57) ABSTRACT

Provided is a light emitting device. The light emitting device includes a plurality of metal layers including first and second metal layers spaced from each other, a first insulation film disposed on a top surface of the plurality of metal layers, the first insulation film having a width wider than an interval between the plurality of metal layers, a light emitting chip disposed on the first metal layer of the plurality of metal layers, and a resin layer disposed on the first metal layer, the first insulation film, and the light emitting chip. The first metal layer includes a first base part dispose on the light emitting chip and a first side part bent from the first base part on an outer portion of the first base part.

16 Claims, 10 Drawing Sheets

FOREIGN PATENT DOCUMENTS

| | | |
|---|---|---|
| JP | 2000-252524 A | 9/2000 |
| JP | 2002-314148 A | 10/2002 |
| JP | 2002-368285 A | 12/2002 |
| JP | 2005-108519 A | 4/2005 |
| JP | 2005-531152 A | 10/2005 |
| JP | 2005-535135 A | 11/2005 |
| JP | 2006-303458 A | 11/2006 |
| JP | 2007-513520 A | 5/2007 |
| JP | 2007-150228 A | 6/2007 |
| JP | 2008-192909 A | 8/2008 |
| JP | 2008-227166 A | 9/2008 |
| JP | 2008-282932 A | 11/2008 |
| JP | 2010-40791 A | 2/2010 |
| JP | 2010-87331 A | 4/2010 |
| JP | 2010-114387 A | 5/2010 |
| KR | 10-0869530 B1 | 11/2008 |
| KR | 10-2008-0113132 A | 12/2008 |
| KR | 10-2010-0035957 A | 4/2010 |
| KR | 10-2010-0083907 A | 7/2010 |

* cited by examiner

LIGHT EMITTING DEVICE AND LIGHTING SYSTEM HAVING THE SAME

CROSS-REFERENCE TO RELATED APPLICATIONS

The present application claims priority under 35 U.S.C. 119 and 35 U.S.C. 365 to Korean Patent Application No. 10-2010-76465 filed on Aug. 9, 2010, which is hereby incorporated by reference in its entirety.

BACKGROUND

Embodiments relate to a light emitting device and a lighting system having the same.

Light emitting diodes (LEDs) are a kind of semiconductor device for converting electrical energy into light. Such an LED has advantages such as low power consumption, a semi-permanent life cycle, a fast response time, safety, and environment friendly compared to the related art light source such as a fluorescent lamp and an incandescent bulb. Many studies are being in progress in order to replace the existing light sources with LEDs. Also, the LEDs are being increasingly used according to the trend as light sources of a variety of lamps used in indoor and outdoor places and lighting devices such as liquid crystal display devices, scoreboards, and street-lamps.

SUMMARY

Embodiments relate to a light emitting device having a new structure and a lighting system having the same.

Embodiments provide a light emitting device including an insulation film supporting a plurality of metal layers each having a bent outer part and a light emitting chip electrically connected to the plurality of metal layers and a lighting system having the same.

Embodiments provide a light emitting device in which a guide member is disposed around a light emitting chip and a resin layer is disposed in the guide member and a lighting system having the same.

In one embodiment, a light emitting device includes: a plurality of metal layers including first and second metal layers spaced from each other; a first insulation film disposed on a top surface of the plurality of metal layers, the first insulation film having a width wider than an interval between the plurality of metal layers; a light emitting chip disposed on the first metal layer of the plurality of metal layers; and a resin layer disposed on the first metal layer, the first insulation film, and the light emitting chip, wherein the first metal layer includes a first base part dispose on the light emitting chip and a first side part bent from the first base part on an outer portion of the first base part.

In another embodiment, a light emitting device includes: a plurality of metal layers including first and second metal layers spaced from each other; a first insulation film disposed on the plurality of metal layers, the first insulation film having a width wider than an interval between the plurality of metal layers; a second insulation film disposed around top surfaces of the plurality of metal layers, the second insulation film being connected to the first insulation film; a light emitting chip disposed on at least one of the plurality of metal layers, the light emitting chip being electrically connected to the first and second metal layer; and a resin layer disposed on at least one of the plurality of metal layers and the light emitting chip, wherein each of inside portions of the plurality of metal layers has a cavity having a depth less than that of each of outer portions of the plurality of metal layers.

In further another embodiment, a light emitting device includes: a plurality of metal layers including first and second metal layers spaced from each other; a first insulation film disposed on the plurality of metal layers, the first insulation film having a width wider than an interval between the plurality of metal layers; a second insulation film connected to the first insulation film around top surfaces of the plurality of metal layers, the second insulation film having an opened area in which portions of the plurality of metal layers are opened; a guide member disposed on the second insulation film; a light emitting chip disposed on at least one of the plurality of metal layers, the light emitting chip being electrically connected to the first and second metal layers; and a resin layer disposed within the guide member, wherein each of inside portions of the plurality of metal layers has a cavity having a depth less than that of each of outer portions of the plurality of metal layers.

The details of one or more embodiments are set forth in the accompanying drawings and the description below. Other features will be apparent from the description and drawings, and from the claims.

DETAILED DESCRIPTION OF THE EMBODIMENTS

Figure 1:
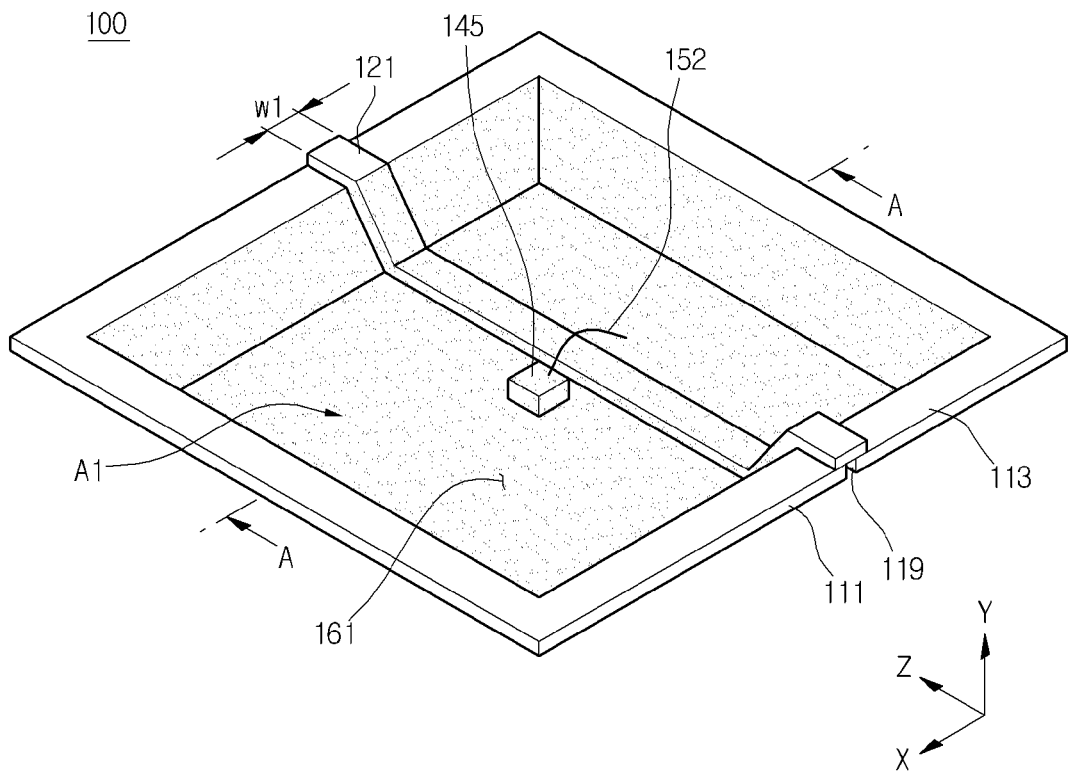
FIG. 1 is a perspective view of a light emitting device according to a first embodiment.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. In the drawings, the thickness or size of each layer is exaggerated, omitted, or schematically illustrated for convenience in description and clarity.

Hereinafter, embodiments will be described with reference to the accompanying drawings.

Figure 2:
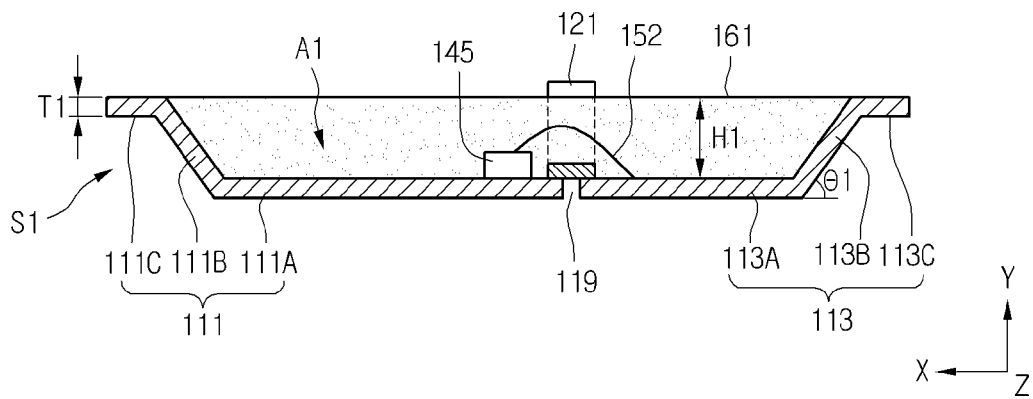
FIG. 2 is a side-sectional view taken along line A-A of FIG. 1.

FIG. 1 is a perspective view of a light emitting device according to a first embodiment. FIG. 2 is a side-sectional view taken along line A-A of FIG. 1.

Referring to FIGS. 1 and 2, a light emitting device 100 includes a plurality of metal layers 111 and 113 defiling a cavity A1, an insulation film 121 disposed on an interface between the plurality of metal layers 111 and 113, a light emitting chip 145 disposed on one metal layer 111 of the plurality of metal layers 111 and 113, and a resin layer 161 molding the light emitting chip 145.

The plurality of metal layers 111 and 113 may include at least two layers. The at least two metal layers 111 and 113 may be physically spaced from each other. The metal layers 111 and 113 may be realized using a metal plate such as a lead frame.

The plurality of metal layers 111 and 113 may be formed of an alloy Fe, Cu, an alloy containing Fe such as Fe—Ni, Al, an alloy containing Al, or an alloy containing Cu such as Cu—Ni and Cu—Mg—Sn. Also, each of the metal layers 111 and 113 may be provided as a single or multi layer. Also, a reflective layer formed of Al, Ag, or Au or a bonding layer may be disposed on top and/or lower surfaces of the metal layers 111 and 113.

When the metal layers 111 and 113 are formed with the lead frames, mechanical strength and thermal conductivity may be superior. In addition, a thermal expansion coefficient may be large, machinability may be improved, there may be a little loss when a bending operation is repeatedly performed, and a plating or soldering process may be easily performed. An oxidation prevention coating layer may be disposed on surfaces of the first and second metal layers 113, but is not limited thereto.

Each of the metal layers 111 and 113 may have a thickness of about 15 μm to about 300 μm, and preferably, about 15 μm to about 50 μm. Also, the metal layers 111 and 113 may serve as a support frame for supporting the entire light emitting device and a heat-dissipating member for conducting heat generated from the light emitting chip 41. The plurality of metal layers 111 and 113 has a same thickness from each other.

Since the metal layers 111 and 113 are not provided as separate bodies, e.g., do not have a structure in which the metal layers 111 and 113 are fixed using a resin-based body formed of polyphthalamide (PPA), a portion of the metal layers 111 and 113 may have a curved shape or be bent at a predetermined angle.

A cavity A1 may be defined in each of the plurality of metal layers 111 and 113. The cavity A1 may have a predetermined depth H1, e.g., about 350 μm or more with respect to an outer top surfaces of the metal layers 111 and 113.

The plurality of metal layers 111 and 113 include a first metal layer 111 and a second metal layer 113. The first and second metal layers 111 and 113 are divided by performing an etching or cutting process on original plates of the metal layers 111 and 113.

The cavity A1 defined inside each of the first and second metal layers 111 and 113 may have an opened upper side. The cavity A1 may have a polygonal shape or a circular shape when viewed from an upper side. Also, the cavity A1 defined inside each of the first and second metal layers 111 and 113 may have opened side surfaces except the opened upper side, but is not limited thereto.

Areas corresponding between the first and second metal layers 111 and 113 may be physically spaced from each other by a separation part 119. For example, the separation part 119 may have a line shape in a direction equal to a z-axis direction or a polygonal shape. The separation part 119 may have a constant width between the first and second layers 111 and 113 or widths different from each other according to the areas. Also, the separation part 119 may have a line shape or a curved shape, but is not limited thereto.

The first and second metal layers 111 and 113 may be spaced an interval of about 10 μm from each other. Due to the interval, it may prevent the two metal layers 111 and 113 from being electrically short-circuited with each other.

The first or second metal layer 111 or 113 may have a polygonal outer shape. Alternatively, the first or second metal layer 111 or 113 may have a sphere outer shape.

The first metal layer 111 includes a base part 111A, a side part 111B, and an outer part 111C. The second metal layer 113 includes a base part 113A, a side part 113B, and an outer part 113C. Each of the metal layers 111 and 113 may have a length in a Z-axis direction wider than a width in an X-axis direction.

The base parts 111A and 113A of the first and second metal layers 111 and 113 may be bonding parts boned to a board. A power may be supplied into each of the base parts 111A and 113A. The light emitting chip 145 may be mounted on the base part 111A of the first metal layer 111. The light emitting chip 145 may be die-bonded to the base part 111A of the first metal layer 111 and electrically connected to the base part 111A of the first metal layer 111. Also, the light emitting chip 145 may be connected to the second metal layer 113 through a wire 152.

The side part 111B of the first metal layer 111 and the side part 113B of the second metal layer 113 may face each other with respect to the Z-axis and the X-axis directions of the cavity A1. The part 111B of the first metal layer 111 and the side part 113B of the second metal layer 113 may correspond to each other with respect to inclined surfaces around the light emitting chip 145.

Both side parts 111B of the first metal layer 111 in the Z-axis direction may face each other. Also, both side parts 113B of the second metal layer 113 in the Z-axis direction may face each other.

As shown in FIG. 2, the side parts 111B and 113B of the first and second metal layers 111 and 113 may inclinedly extend from extending lines of the base parts 111A and 113A at a predetermined angle θ1, e.g., about 15° to about 90°.

The outer parts 111C and 113C of the first and second metal layers 111 and 113 may horizontally extend outward from each of the side parts 111B and 113B. The outer part 111C of the first metal layer 111 and the outer part 113C of the second metal layer 113 may be disposed parallelly with respect to the extending lines of the base parts 111A and 113A mounted on the light emitting chip 145. Since the outer parts 111C and 113C of the first and second metal layers 111 and 113 are spaced from the base part 111A and 113A of the light emitting device 100, a predetermined external space S1 may be defined. The external space S1 may effectively release heat transferred from the side parts 111B and 113B.

The outer parts 111C and 113C of the first and second metal layers 111 and 113 may be stepped from the base parts 111A and 113A to provide a top surface having a circumference with a polygonal shape on an outer circumference of the light emitting device 100. In the current embodiment, the cavity A1 may have a circular shape, but a polygonal shape, but is not limited thereto.

At least one of top surface, lower surfaces, and side surfaces of the first and second metal layers 111 and 113 may have an uneven structure. Due to the uneven structure, surface areas of the metal layers 111 and 113 may increase to improve the thermal efficiency.

The insulation film 121 is attached to top surfaces of the first and second metal layers 111 and 113. The insulation film 121 may be attached to a top surface of an area on which the first and second metal layers 111 and 113 correspond to each other. For example, the insulation film 121 has a width wider than that of the separation part 19 of the two metal layers 111 and 113 adjacent to each other and is attached to the top surfaces of the metal layers 111 and 113. Thus, the insulation film 121 may maintain an interval between the metal layers 111 and 113 by a predetermined value to support and fix the metal layers 111 and 113. The insulation film 121 covers the separation part 119 disposed between the metal layers 111 and 113. In this case, it may prevent a liquid resin material from leaking in a process in which a resin layer 161 is formed through the separation part 119.

The insulation film 121 may extend up to the side parts 111B and 113B and outer parts 111C and 113C of the metal layers 111 and 113.

The second insulation film 121 may have a width W1 wider than an interval between the first and second metal layers 111 and 113 or a width of the separation part 119. For example, the insulation film 121 may have a width of several μm or more, and preferably, about 20 μm or more.

The insulation film 121 may include a light-transmitting or non-light-transmitting film. For example, each of the insulation films 21 and 23 may include a polyimide (PI) film, a polyethylene terephthalate (PET) film, an ethylene vinyl acetate (EVA) film, a polyethylene naphthalate (PEN) film, a triacetyl cellulose (TAC) film, a polyamide imide (PAI) film, a polyether ether ketone (PEEK) film, a perfluoroalkoxy (PFA) film, a polyphenylene sulfide (PPS) film, and resin films (PE, PP, and PET).

An adhesion layer may be disposed between the insulation film 121 and the metal layers 111 and 113. The adhesion layer may attach the insulation film 121 to the metal layers 11 and 13. Alternatively, the insulation film 121 may include an adhesion layer such as a double-sided adhesive tape or a single adhesive tape.

The insulation film 121 may be formed of a material having a predetermined reflective index, e.g., a reflective index of about 30% or more. The reflection characteristic of the insulation film 121 may improve surface reflection efficiency within the light emitting device.

Also, each of the insulation film 121 may have an optical function. Here, the optical function may be a function of a light-transmitting film having reflectance of about 50% or more, and preferably, a film having reflectance of about 70%.

The insulation film 121 may include a phosphor. The phosphor may be coated on a top or lower surface of each of the insulation film 121 or added into the insulation film 121. The phosphor may include at least one of a YAG-based phosphor, a silicate-based phosphor, and a nitride-based phosphor. The phosphor may have a visible light-based wavelength such as a wavelength of a red, yellow, or green color. Also, the insulation film 121 may be realized as a phosphor film. The phosphor film may absorb light emitted from the light emitting chip 145 to emit light having a different wavelength.

Also, the insulation film 121 may include a moisture resistance film. The moisture resistance film may prevent moisture from being permeated to prevent the first and second metal layers 111 and 113 from being oxidized and electrically short-circuited.

The insulation film 121 may use film series. For example, a portion of a top, lower, or side surface of the insulation film 121 may have an uneven structure, but is not limited thereto.

The insulation film 121 may have a thickness thicker than that of each of the metal layers 111 and 113. For example, the insulation film 121 may have a thickness of about 30 μm to about 500 μm, and preferably, a thickness of about 40 μm to about 60 μm.

The light emitting chip 145 may be disposed on the first metal layer 111 and electrically connected to the first and second metal layers 111 and 113.

The light emitting chip 145 may be a light emitting diode having a wavelength band of visible light and emitting red, green, blue, or white light or a light emitting diode having a wavelength band of ultraviolet (UV), but is not limited thereto.

The light emitting chip 145 may be realized as a lateral type chip in which two electrodes are disposed in parallel to each other or a vertical type chip in which two electrodes are disposed on sides opposite to each other. The lateral type chip may be connected to at least two wires, and the vertical type chip may be connected to at least one wire 152. Although the vertical type chip is described in FIGS. 1 and 2, the present disclosure is not limited thereto.

The light emitting chip 145 may adhere to the first metal layer 111 using a conductive adhesive. Here, when an electrode is disposed on a lower portion of the light emitting chip 145, the conductive adhesive may adhere and thus be electrically connected to the first metal layer 111.

The light emitting chip 145 is die-bonded to the first metal layer 111 and is connected to the second metal layer 113 through a wire 152. Also, the light emitting chip 145 may be electrically connected to the first and second metal layers 111 and 113 in a flip chip type. Although the light emitting chip 145 is disposed on the first metal layer 111, the light emitting chip 145 may be disposed on the second metal layer 113, but is not limited thereto.

Here, the light emitting chip 145 may have a thickness of about 80 μm or more. The highest point of the wire 152 may be disposed at a position higher by about 100 μm or more from the top surface of the light emitting chip 145.

A phosphor layer may be coated on the top surface of the light emitting chip 145. The phosphor layer may be disposed within the top surface of the light emitting chip 145.

A protective device may be disposed above or under at least one of the first and second metal layers 111 and 113. A device such as a Zener diode or transient voltage suppressor (TVS) diode may be used as the protective device. Also, the protective device may be electrically connected to the light emitting device 145 and circuitly protect the light emitting chip 145. The protection device may be connected to the first and second metal layers 111 and 113 and connected to the light emitting chip 41 in parallel. Thus, the protection device may protect the light emitting chip 145 against an abnormal voltage applied into the light emitting chip 145. The protection device may be omitted.

The resin layer 161 may be disposed in an area of the cavity A1 of the first and second metal layers 111 and 113 to seal the light emitting chip 145. The resin layer 161 may be formed of a transparent resin-based material, e.g., silicon or epoxy resin.

The resin layer 161 may have a thickness of about 80 µm to about 500 µm. The resin layer 161 may be provided as a single or multi layer. When the resin layer 161 has the multi-layered structure, the lowermost layer may have a thickness less than that of about 80 µm.

When the resin layer 161 has the multi-layered structure, the resin layer 161 may be stacked with the same material as or materials different from each other. Alternatively, the multi layers may be stacked in an order of from a material having a low hardness to a material having a high hardness or from a material having a high reflective index to a material having a low reflective index.

The resin layer 161 may include a phosphor. The phosphor may include at least one of phosphors having a wavelength band of visible light such as yellow, green, or red light. The resin layer 161 may be classified into a transparent resin layer and a phosphor layer. The transparent resin layer and the phosphor layer may be stacked to form the resin layer 161. A phosphor film, e.g., a photo luminescent film (PLF) may be disposed above/under the resin layer 161, but is not limited thereto.

The resin layer 161 may have a flat top surface as shown in FIG. 2. For another example, the resin layer 161 may have a top surface with a concave lens shape or a convex lens shape. The resin layer 161 may be further disposed on the outer parts 111C and 113C of the first and second metal layers 111 and 113, but is not limited thereto.

A lens may be disposed on the resin layer 161. The lens may have a convex lens shape, a concave lens shape, or a convex-concave lens shape. Also, the lens may contact or be spaced from a top surface of the resin layer 161, but is not limited thereto.

FIGS. 3 to 8 are views illustrating a process of manufacturing the light emitting device of FIG. 1.

Figure 3:
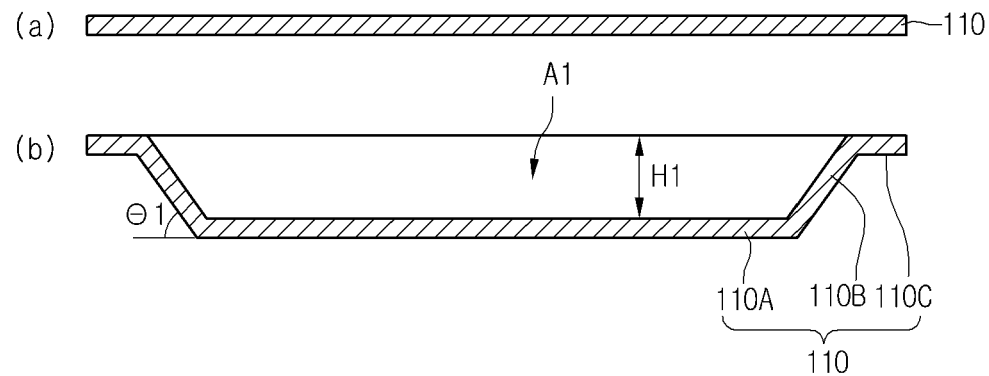
FIGS. 3 to 7 are views illustrating a process of manufacturing the light emitting device of FIG. 1.

Referring to FIG. 3, a metal layer 110 may have a size enough to manufacture one light emitting device as shown in FIG. 1. Alternatively, the metal layer 110 has a size having a bar shape and enough to manufacture a plurality of light emitting devices arrayed in a first direction (horizontal or vertical direction) or a size having a matrix form and enough to manufacture a plurality of light emitting devices arrayed in horizontal and vertical directions. Also, the metal layer on which the plurality of light emitting devices are manufactured may be cut into a unit of an individual light emitting device or two or more light emitting devices. Hereinafter, for description of the current embodiment, a metal layer for manufacturing one light emitting device will be described as an example.

For example, the metal layer 110 may be realized as a metal plate such as a lead frame. The metal layer 110 may be formed of Fe, Cu, an alloy containing Fe such as Fe—Ni, Al, an alloy containing Al, or an alloy containing Cu such as Cu—Mg—Sn. The metal layer 10 may be formed as a single or multi layer. Also, a reflective layer formed of Al, Ag, Au, or solder resist or a bonding layer may be formed on top and/or lower surfaces of the metal layer 10. The plating process or costing process of the metal layer may be performed before or after an insulation film is formed.

The metal layer 110 may have a uniform thickness. For example, the metal layer 110 may have a thickness of about 15 µm to about 300 µm. Thus, the metal layer 110 may serve as a support frame for supporting the entire light emitting device. In the support frame structure, a separate body, e.g., a resin-based body formed of polyphthalamide (PPA) and the metal layer 110 are not injection-molded. Thus, a portion of the metal layer 110 may be bent at a preset angle.

As shown in FIG. 3A, a cavity A1 of FIG. 3B may be defined in the metal layer 110 by performing a pressing process on a flat plate having a predetermined size using press equipment. The cavity A1 may have a predetermined depth H1 with respect to a top side thereof. Also, the cavity A1 may have a stepped shape.

The metal layer 110 includes a base part 110A, a side part 110B, and an outer part 110C. The base part 110A defines a lower surface of the cavity A1 of the metal layer 110. The side part 110B inclinedly extends from the base part 110A at a predetermined angle θ1 to cover a circumference of the cavity A1. The outer part 110C is bent outward from the side part 110B.

The side part 110B of the metal layer 110 may cover the all side directions of the base part 110A or may cover both side directions and open the rest directions. The metal layer 110 may have the cavity A1 having a polygonal shape. In this case, the cavity A1 may have a relatively narrow lower portion width and a relatively wide upper portion width. For another example, the metal layer 110 may have the cavity A1 having a circular shape or an oval shape, but is not limited thereto.

The cavity A1 of the metal layer 110 may have a relatively concave recess structure than the outer parts.

Figure 4:
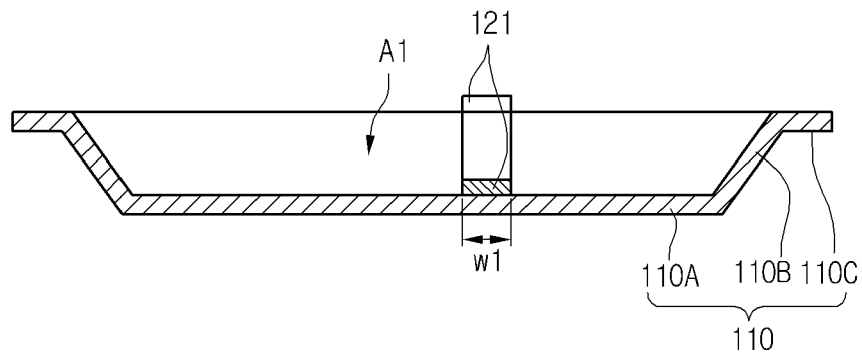

Referring to FIGS. 3 and 4, an insulation film 121 is formed on a top surface of the metal layer 110. The insulation film 121 may be attached to the top surface of the metal layer 110 along a first direction of a center area. Also, the insulation film 121 may be disposed along the base part 110A, the side part 110B, and the outer part 110C of the metal layer 110. The insulation film 121 may be attached along a top surface of an area for dividing the metal layer 110.

The insulation film 121 may be attached to the metal layer 110 after an adhesion layer is coated on the metal layer 110. In the adhesion process of the insulation film 120, the insulation film 120 is attached to the metal layer 110, and then, a lamination process is performed at a predetermined temperature to attach the insulation film 120 to the metal layer 110. Here, although the insulation film 121 is attached to a top surface of the metal layer, the metal layer 110 may be attached to a top surface of the insulation film 121. The processes may be changed in order.

The insulation film 121 may have a predetermined thickness, e.g., a thickness of about 30 µm to about 500 µm. Alternatively, the insulation film 121 may have a thickness thicker than that of the metal layer 110.

The insulation film 121 may be a film having an insulation property. Also, the insulation film 121 may selectively include films having an optical function, a thermally conductive function, and a moisture resistant function. The insulation film 121 may be formed as a film having an adhesion layer such as a double-sided adhesive tape or a single adhesive tape. When the insulation film 121 is formed of a light-transmitting material, the insulation film 121 may include a phosphor or/and a dispersion agent. The phosphor or dispersion agent may be coated on surfaces of the insulation film 121 or added into the insulation film 121. Alternatively, the insulation film 121 may films having a predetermined reflective index, e.g., a reflective characteristic of about 30% or more.

For example, the insulation film 121 may be printed or coated with an insulation material such as oxide such as sapphire ($Al_2O_3$), $SiO_2$, $SiO_x$, or $SiO_xN_y$, or nitride. In this case, the cured insulation film 121 may be formed of a material which is flexible or has a predetermined viscosity.

The insulation film 121 may have a width W1 of at least 20 μm or more. The insulation film 121 may have a width W1 enough to support the divided metal layers. A portion of the width W1 of the insulation film 121 may be further widened. The insulation film 121 may have the substantially same length as a side of the metal layer 110, but is not limited thereto.

Figure 5:
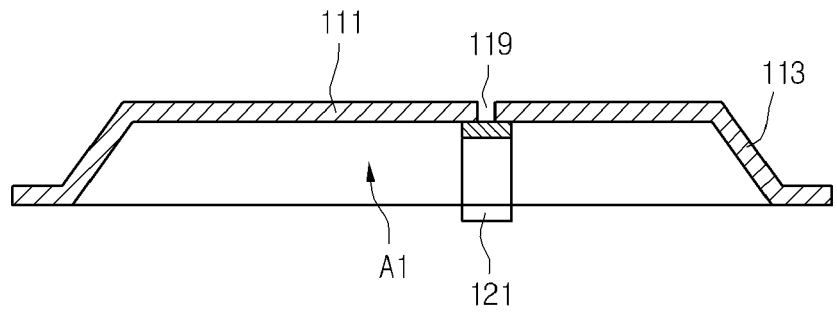

Referring to FIGS. 4 and 5, the metal layer 110 of FIG. 4 may be divided into a plurality of metal layers 111 and 113.

Here, in a process for dividing the metal layer 110, for example, after a surface of the lead frame is activated, a photoresist may be coated, an exposure process may be performed, and a developing process may be performed. When the developing process is completed, an etching process may be performed to divide the required area and exfoliate the photoresist. Thereafter, an Ag plating process may be performed on a surface of the metal layer to treat the surface of the metal layer to a bondable surface.

Then, the metal layer 110 of FIG. 4 is turned over, and an etching process is performed on a top surface of the metal layer in the state equal to that shown in FIG. 5, i.e., a surface opposite to a surface to which the insulation film 121 is attached to divide the metal layer 110 into two metal layers 111 and 113. The division area of the metal layers 111 and 113 may be defined by the separation part 119 and overlap a center area of the insulation film 121. Here, the insulation film 121 may support the a top surface of an interface between the divided metal layers 111 and 113 and constantly maintain the separation part 119 between the first and second metal layers 111 and 113.

The separation part 110 between the first and second metal layers 111 and 113 may have an interval of about 10 μm or more. The interval may be less than a width W1 of the insulation film 121.

Although each of the insulation film 121 and the separation part 119 have a line shape in the current embodiment, each of the insulation film 121 and the separation part 119 may have a hemisphere shape, a polygonal shape, a diagonal line shape, and a mixed shape of straight and curved lines, but is not limited thereto.

Figure 6:
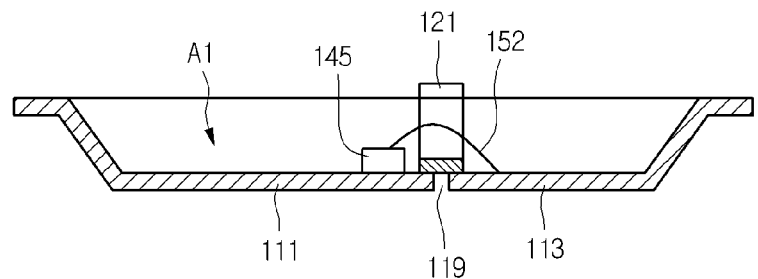
Figure 7:
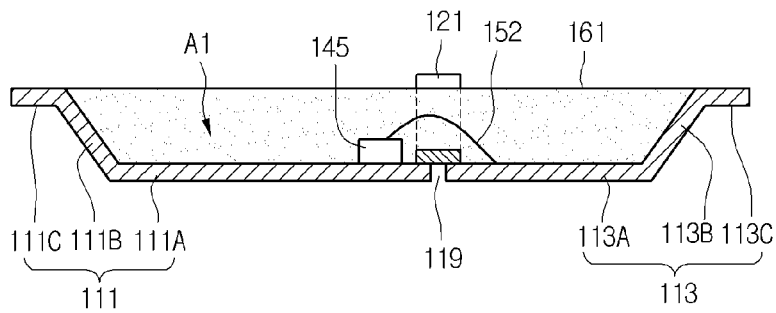

Referring to FIGS. 6 and 7, the light emitting chip 145 may be mounted on the first metal layer 111 and electrically connected to the first and second metal layers 111 and 113.

The light emitting chip 145 may be realized as a lateral type chip in which two electrodes are disposed in parallel to each other or a vertical type chip in which two electrodes are disposed on sides opposite to each other. The light emitting chip 145 may adhere to the first metal layer 111 through the conductive adhesive. Also, the light emitting chip 145 may be electrically connected to the first metal layer 111 and be connected to the second metal layer 113 through a wire 152.

The light emitting chip 145 may be a light emitting diode having a wavelength band of visible light and emitting red, green, blue, or white light or a light emitting diode having a wavelength band of ultraviolet, but is not limited thereto. Here, the light emitting chip 145 may have a thickness of about 80 μm or more. The highest point of the wire 152 may be disposed at a position higher by about 40 μm or more from the top surface of the light emitting chip 145.

The resin layer 161 may be disposed in the cavity A1 defined in each of the first and second metal layers 111 and 113. The resin layer 161 may be formed of a transparent resin-based material, e.g., silicon or epoxy resin.

The resin layer 161 may have a thickness of about 80 μm to about 500 μm. The resin layer 161 may be provided as a single or multi layer. When the resin layer 61 has the multi-layered structure, the lowermost layer may have a thickness less than that of about 80 μm. When the resin layer 161 has the multi-layered structure, the resin layer 161 may be stacked with the same material as or materials different from each other. Alternatively, the multi layers may be stacked in an order of from a material having a low hardness to a material having a high hardness and vice versa.

A portion of a top surface of the resin layer 161 may be higher than that of the insulation film 121. Also, the resin layer 161 may be disposed at a height enough to cover the wire 152, but is not limited thereto.

The resin layer 161 may include a phosphor. The phosphor may include at least one of phosphors having a wavelength band of visible light such as yellow, green, or red light. The resin layer 161 may be classified into a transparent resin layer and a phosphor layer. The transparent resin layer and the phosphor layer may be stacked to form the resin layer 61. A phosphor film, e.g., a photo luminescent film (PLF) may be disposed above/under the resin layer 161, but is not limited thereto.

A lens may be disposed on the resin layer 161. The lens may have a convex lens shape, a concave lens shape, or a convex-concave lens shape, but is not limited thereto. Also, the lens may contact or be spaced from a top surface of the resin layer 161, but is not limited thereto.

Figure 8:
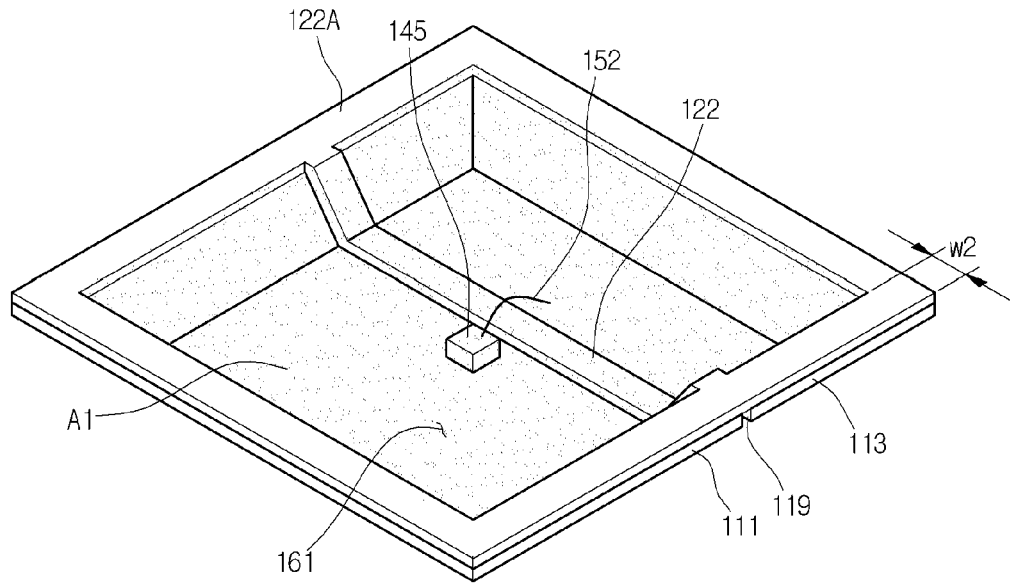
FIGS. 8 and 9 are perspective and side sectional views of a light emitting device according to a second embodiment.
Figure 9:
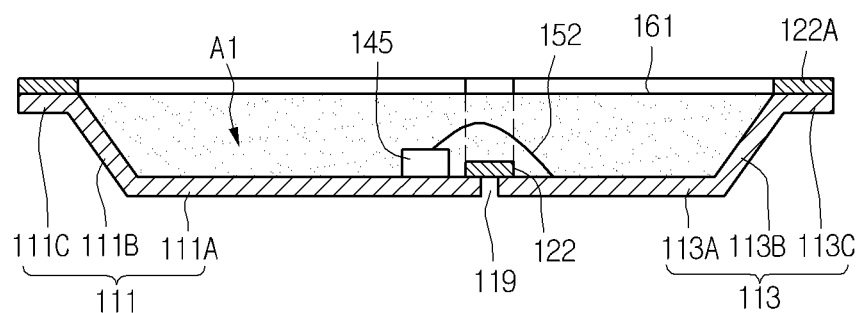

FIGS. 8 and 9 are perspective and side sectional views of a light emitting device according to a second embodiment. In description of the second embodiment, the same part as that of the first embodiment will be described with reference to the first embodiment.

Referring to FIGS. 8 and 9, in a light emitting device, a first insulation film 122 is disposed on an area in which first and second metal layers 111 and 113 adjacent each other correspond to each other. Also, a second insulation film 122A is disposed along top surfaces of the first and second metal layers 111 and 113. The second insulation film 122A extends from the first insulation film 122. Also, the second insulation film 122A may be disposed in a ring or loop shape along top surfaces of outer parts 111C and 113C of the first and second metal layers 111 and 113. The second insulation film 122A may have the same width as each of the outer parts 111 and 113C of the metal layers 111 and 113 or a width less than that of each of the outer parts 111 and 113C of the metal layers 111 and 113. The second insulation film 122A together with the first insulation film 121A may support and fix the two metal layers 111 and 113.

The first and second insulation films 122 and 122A may adhere to top surfaces of base parts 111A and 113A and top surfaces of outer parts 111C and 113C between the first and second metal layers 111 and 113 to support and fix a gap between the two metal layers 111 and 113.

The second insulation film 122A may be disposed around the top surfaces of the two metal layers 111 and 113 to prevent a resin layer 161 from overflowing. Also, the surrounding of the resin layer 161 may be lower than the top surface of the second insulation film 122A, but is not limited thereto.

Since the insulation films 122 and 122A adhere using insulation film series, the insulation films 122 and 122A may adhere other areas except the above-described area.

Figure 10:
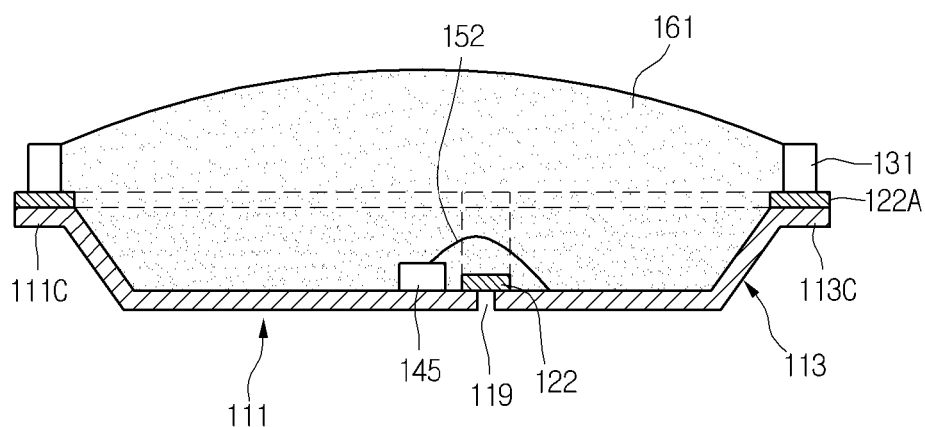
FIG. 10 is a side sectional view of a light emitting device according to a third embodiment.

FIG. 10 is a side sectional view of a light emitting device according to a third embodiment.

Referring to FIG. 10, a light emitting device includes a guide member 131 on a second insulation film 122A. The guide member 131 is disposed along a top surface of the second insulation film 122A. For example, each of the second insulation film 122A and the guide member 131 may have a ring shape or a loop shape to cover the surrounding of a resin layer 161.

The guide member 131 has a width less than that of the second insulation film 122A and protrudes in a thickness direction of the second insulation film 122A. The guide member 131 may have a thickness of about 15 μm to about 500 μm. Also, the guide member 131 may have a thickness equal to or different from that of each of the insulation films 121 and 122A.

Here, one of a printing process, a costing process, or a film adhesion process may be performed to form the guide member 131. In the printing process, a masking process may be performed on an area except an area to be printed and a screen printing process may be performed to form the guide member 131. In the coating process, a reflective material may be coated to form the guide member 131. In the film adhesion process, a film such as a reflective sheet may adhere to form the guide member 131. Here, materials of the guide member 131 and the insulation films 122 and 122A may be selected in consideration of thermal characteristics due to a wire bonding or reflow process.

The guide member 131 may be manufactured in a printing manner. The guide member 131 may be formed of a resin material such as solder resist or a conductive material such as solder paste. The solder resist may have a white color to effectively reflect incident light. Also, the guide member 131 may be formed of a high-reflective material, e.g., Ag, Al, Cu, Au, Ag-alloy, Al-alloy, Cu-Alloy, or Au-alloy. The reflective material may be provided as a single or multi layer. Also, a plating process may be performed on a metal seed layer, e.g., on a material such as Ag, Al, or Ni to form the guide member 131.

Also, the guide member 131 may be formed of a non-metallic material. The non-metallic material may include a white resin, for example, a resin material containing $TiO_2$, a resin material (e.g., PPA) containing glass fiber, or a polymer material (silicon-based or epoxy-based). When the guide member 131 has insulating and reflective characteristics, a separate insulation film may be unnecessary, but is not limited thereto.

The guide member 131 may be formed of a metal or non-metal material having a reflection characteristic of about 50% or more, and preferably, a reflection characteristic of about 90% or more.

When the guide member 131 is formed of a conductive material, the guide member 131 may be spaced from the metal layers 111 and 113. That is, the guide member 131 may be disposed so that it 131 does not get out of a top surface of the second insulation film 122A to prevent the guide member 131 from being electrically short-circuited. The guide member 131 may extends onto the first insulation film 122, but is not limited thereto.

The guide member 131 may have a ring or loop shape. Also, the guide member 131 may have a continuous or discontinuous shape. Here, when the guide member 131 has the discontinuous shape, the guide member 131 may contact one of the first and second metal layers 111 and 113.

The guide member 131 may be a reflective member or a barrier serving as a dam. Also, the guide member may be formed of a material having a superior reflective characteristic than those of the insulation films 122 and 122A.

The resin layer 161 may have a height at which the resin layer 161 contacts an inner surface of the guide member 131. Also, the resin layer 161 may have a convex surface, but is not limited thereto. The resin layer 161 may be provided as a single or multi layer. Also, the resin layer 161 may have a surface on which a concave portion or/and a convex portion may be disposed.

Figure 11:
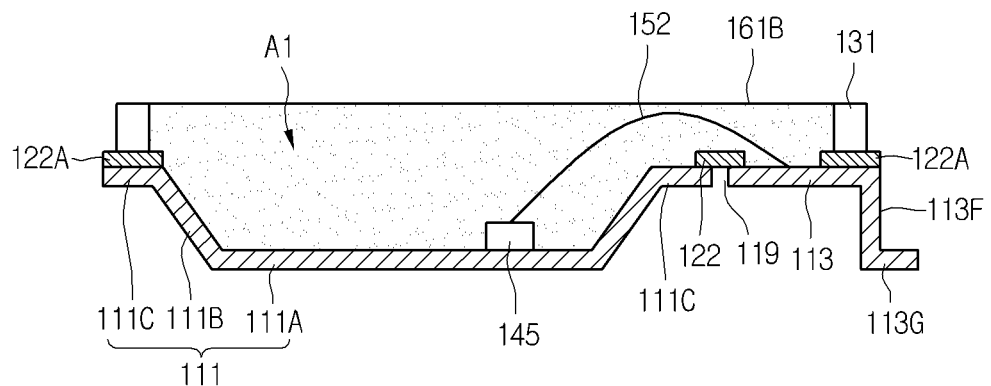
FIG. 11 is a side sectional view of a light emitting device according to a fourth embodiment.

FIG. 11 is a side sectional view of a light emitting device according to a fourth embodiment.

Referring to FIG. 11, in a light emitting device, a cavity A1 is defined inside a first metal layer 111. A second metal layer 113 corresponds to one side surface of outer parts 111C of the first metal layer 111. A base part 111A of the first metal layer 111 may be a bonding area. A side part 111B may extend inclinedly from the base part 111A toward two sides, three sides, or four sides. The outer part 111C extends from the side part 111B.

A second metal layer corresponds to at least one side of the outer part 111C of the first metal layer 111. A first insulation film 122 is disposed on an area between the outer part 111C of the first metal layer 111 and the second metal layer 113. The first insulation film 122 is attached to a top surface of an interface between the first metal layer 111 and the second metal layer 113 to maintain an interval between the two metal layers 111 and 113 and support the two metal layers 111 and 113.

The second metal layer 113 has the other end extending to a side part 113F vertically bent downward and a horizontal base part 113G. The base part 113G of the second metal layer 113 may be used as a terminal for supplying a second power source.

The second metal layer 113 is connected to a light emitting chip 145 disposed on the base part 111A of the first metal layer 111 through a wire 152. The wire 152 may have a predetermined height difference from a top surface of the light emitting chip 145 and be bonded to the second metal layer 113.

The first insulation film 122 is attached to an interface between the first and second metal layers 111 and 113, and the second insulation film 122A is attached around the outer part 111C of the first metal layer 111 and a top surface of the second metal layer 113. The first and second insulation films 122 and 122A may be connected to each other.

A guide member 131 is disposed on the second insulation film 122A. The guide member 131 may be formed of a reflective material. The guide member 131 may be formed of a material disclosed in the above-described.

A resin layer 161B may be molded within a cavity A1 defined in each of the first and second metal layers 111 and 113. The guide member 131 may prevent the resin layer 161B from overflowing. The resin layer 161B may have a surrounding which is flush with a top surface of the guide member 131. Also, resin layer 161B may have a flat surface or a surface having a concave or convex shape.

Figure 12:
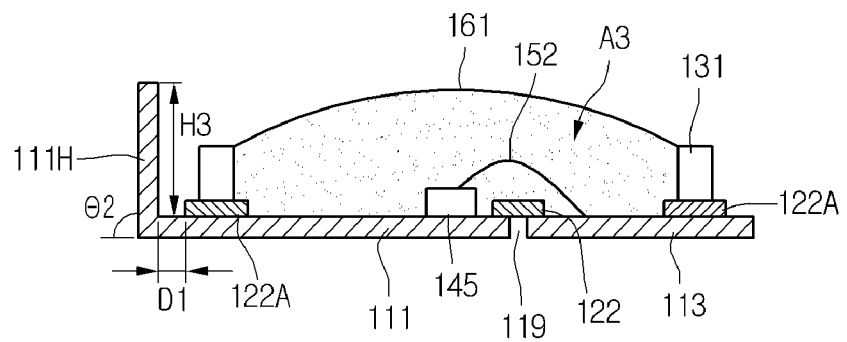
FIG. 12 is a sectional view of a light emitting device according to a fifth embodiment.
Figure 13:
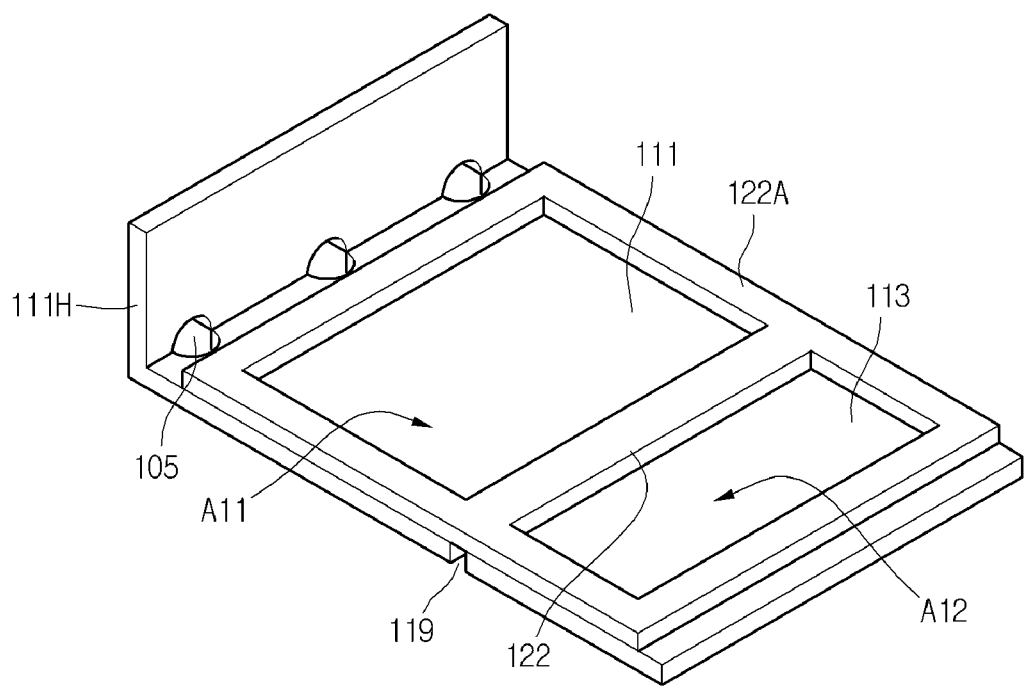
FIG. 13 is a perspective view of metal layers in the light emitting device of FIG. 12.

FIG. 12 is a side sectional view of a light emitting device according to a fifth embodiment. FIG. 13 is a perspective view illustrating a state in which an insulation film is disposed on the metal layer of FIG. 12.

Referring to FIG. 12, in a light emitting device, one metal layer of at least two metal layers 111 and 113 may serve as a light leakage blocking layer.

The first metal layer 111 includes a light blocking part 111H. The light blocking part 111H may be bent at a predetermined angle θ2, e.g., about 70° to about 120° from a lower surface of the first metal layer 111 on a side opposite to that corresponding to the second metal layer 113.

Figure 24:
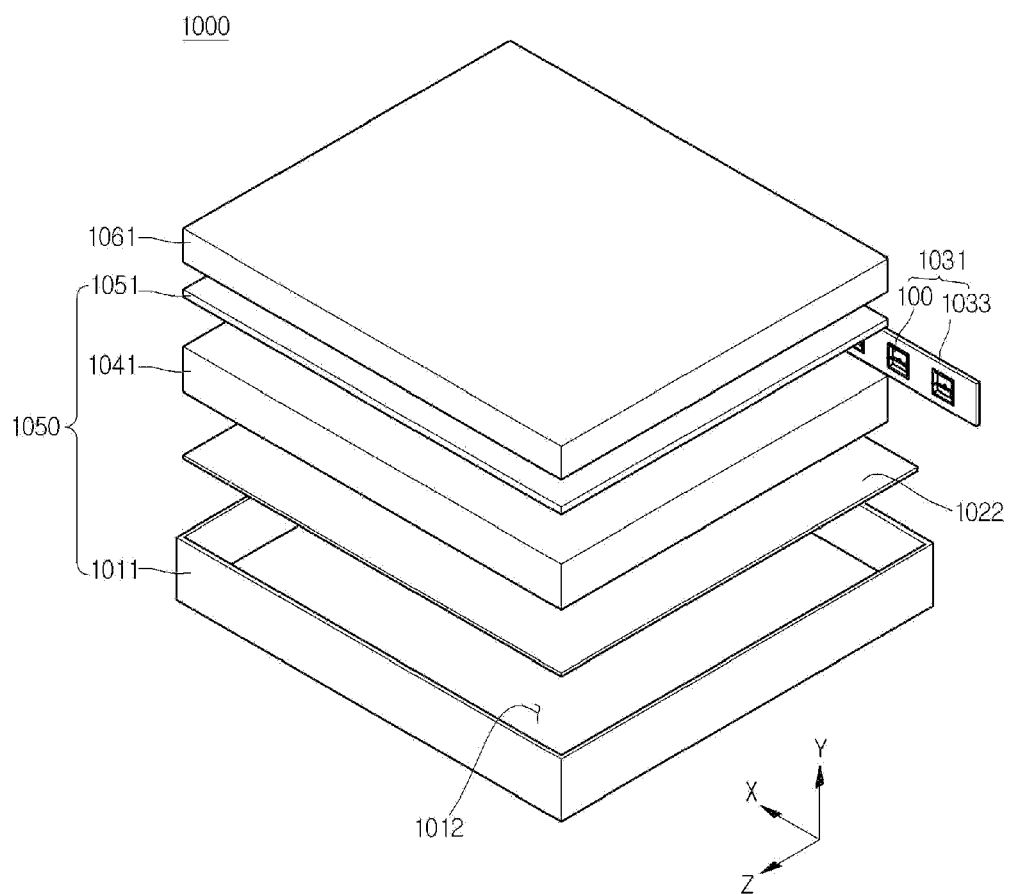
FIG. 24 is a perspective view illustrating an example of a display device according to an embodiment.

The light blocking part 111H of the first metal layer 111 may reflect light. Thus, when the light emitting devices are arrayed as shown in FIG. 24, the light blocking part 111H of the first metal layer 111 may contact a top surface of a light guide plate 1041 to prevent light from leaking between the light guide plate 1041 and the light emitting device. The light blocking part 111A of the first metal layer 111 may block light emitted from the light emitting chip 145 to prevent light from leaking in a backlight unit of FIG. 24.

The first insulation film 122 is attached to a top surface between the first metal layer 111 and the second metal layer 113. The second insulation film 122A is disposed around top surfaces of the first and second metal layers 111 and 113 and thus is connected to the first insulation film 122. The light emitting chip 145 is disposed on the first metal layer 111 between the first and second insulation films 122 and 122A, and a wire 152 is bonded to the second metal layer 113. A guide member 131 is disposed on the second insulation film 122A. The resin layer 161 is molded to an inner area of the guide member 131.

Each of the second insulation film 122A and the guide member 131 may have a ring shape around the top surfaces of the first and second metal layers 111 and 113. Also, each of the second insulation film 122A and the guide member 131 may have a continuous or discontinuous shape. Also, each of the second insulation film 122A and the guide-member 131 may have a top surface having an uneven structure.

The guide member 131 may have an upper end lower than that of the light blocking part 111H of the first metal layer 111.

An inner area of each of the second insulation film 122A and the guide member 131 may be an opened area in which the inside thereof is opened.

FIG. 13 is a perspective view illustrating a state in which an insulation film is disposed on the metal layers of FIG. 12.

Referring to FIGS. 12 and 13, the insulation films 122 and 122A are attached to the top surfaces of first and second metal layers 111 and 113. An inner area A3 of the second insulation film 122A of FIG. 12 may be divided into an inner area A11 of the first metal layer 111 and an inner area A12 of the second metal layer 113 by the first insulation film 122. Here, although each of the inner areas A11 and A12 has a square shape, each of the inner areas A11 and A12 may have a circular or polygonal shape. Also, the inner area A11 of the first metal layer 111 may have a size enough to bond the lit emitting chip, e.g., a size spaced an interval of several mm or less from the light emitting chip. The inner area A13 of the second metal layer 113 may be opened to allow a wire to be bonded.

At least one hole 105 may be defined in a portion at which the light blocking part 111H is bent from the first metal layer 111. The hole 105 may be provided in plurality. The plurality of holes may be spaced a predetermined interval from each other along the bent portion. When the light blocking part 111H is bent form the first metal layer 111, the light blocking part 111H may be easily bent by the hole 105. For another example, a groove may be defined in a bent portion between the first metal layer 111 and the light blocking part 111H to allow the light blocking part 111H to be easily bent.

Figure 14:
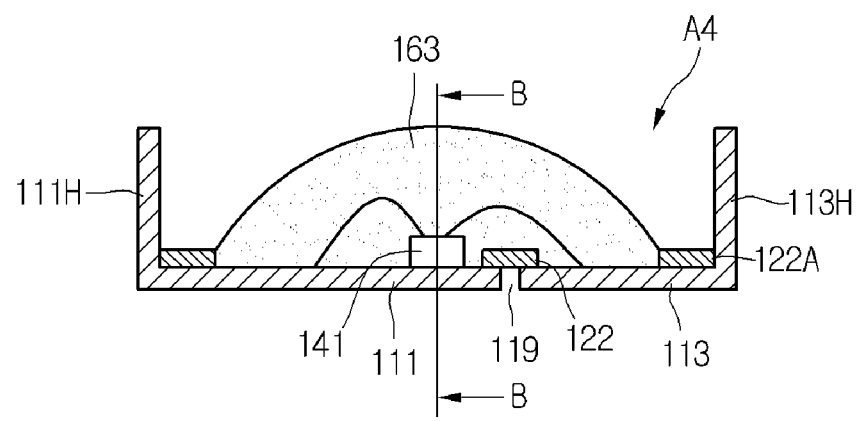
FIG. 14 is a sectional view of a light emitting device according to a sixth embodiment.
Figure 15:
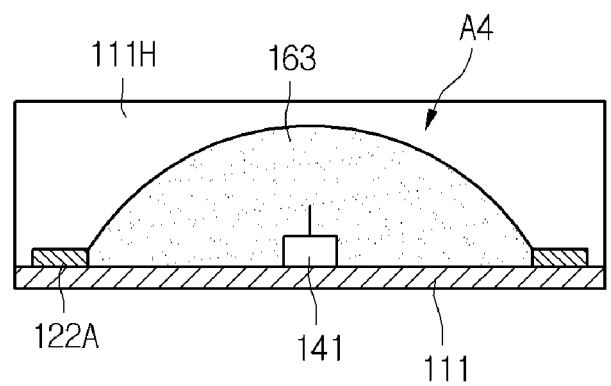
FIG. 15 is a side sectional view taken along line B-B of FIG. 14.

FIG. 14 is a side sectional view of a light emitting device according to a sixth embodiment. FIG. 15 is a side sectional view taken along line B-B of FIG. 14.

Referring to FIG. 14, a light emitting device includes light blocking parts 111H and 113H in which outer parts of metal layers 111 and 113 are vertically bent with respect to an inside portion. The light blocking parts 111H and 113H may reflect incident light into both sides or all sides of a light emitting chip 141.

For example, the light blocking part 111H and 113H of the first and second metal layers 111 and 113 may correspond to the light emitting chip 141 and an upper portion of the light blocking part 111H and 113H may be disposed at positions higher than the highest point of a resin layer 163 to prevent light from leaking in side directions.

According to the current embodiment, the outer parts of the first and second metal layers 111 and 113 may be vertically bent and thus may serve as light blocking parts 111H and 113H. Thus, the outer parts may contact top and lower surfaces of a light guide plate 1041 of a backlight unit of FIG. 24. Here, the light blocking part 111H and 113H of the light emitting device may effectively block light leaking toward upper and lower sides of the light guide plate (see reference numeral 1041 of FIG. 24).

Also, a first insulation film 122 is attached to a top surface between the first and second metal layers 111 and 113. A second insulation film 123 is disposed around flat top surfaces of the first and second metal layers 111 and 113 to support the two metal layers 111 and 113.

The second insulation film 122A may prevent a resin layer 163 for molding the light emitting chip 141 from overflowing.

FIG. 15 is a sectional view taken along line B-B' of FIG. 14 and illustrates the other side of the first metal layer 111.

Referring to FIG. 15, the other outer part of the first metal layer 111 may be flat without providing a protruding structure such as the light blocking part 111H. A second insulation film 122A is disposed around the resin layer 153. Here, the other outer part of the first metal layer 111 may have an inclined structure, but the flat structure. Alternatively, the other outer part of the first metal layer 111 may protrude at a height less than that of the light blocking part 111H. Descriptions of the other outer part of the second metal layer will refer to that of the first metal layer.

Figure 16:
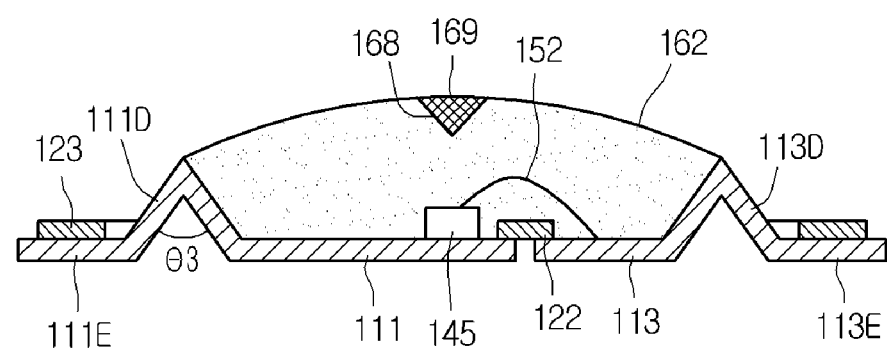
FIG. 16 is a side sectional view of a light emitting device according to a seventh embodiment.

FIG. 16 is a side sectional view of a light emitting device according to a seventh embodiment.

Referring to FIG. 16, a light emitting device includes a side structure having a triangular or hemisphere shape on outer parts of first and second metal layers 111 and 113. The outer parts 111E and 113E may be realized as flat plates, respectively.

A side part 111D of the first metal layer 111 may include a first inclined surface inclined with respect to a surface on which a light emitting chip 145 is mounted and a second inclined surface bent at an interior angle θ3, i.e., about 180° or less with respect to the first inclined surface. The side part 111D may have a triangular shape in section. The side part 111D may have a polygonal or hemisphere shape in sectional, but the triangular shape, but is not limited thereto.

An outer part 111E of the first metal layer 111 may be flush with a surface on which the light emitting chip 145 is mounted from the side part 111D. Alternatively, the outer part 111E may be disposed at a position higher or lower than that of the surface on which the light emitting chip 145 is mounted.

The side part 113D and the outer part 113E of the second metal layer 113 may have structures symmetrical to those of the first metal layer 111. Thus, description of the first metal layer 111 will refer to that of the first metal layer 111.

An interior angle defined in the side parts 111D and 113D of the first and second metal layers 111 and 113 may reflect light emitted from the light emitting chip 145 to realize an angle having a desired orientation distribution.

Also, the side part 111D of the first metal layer 111 and the side part 113D of the metal layer 113 may improve a strength of the light emitting device.

Each of the second insulation film 122A and the guide member 123 may have a ring shape around the top surfaces of the first and second metal layers 111 and 113. Also, each of the second insulation film 122A and the guide member 131 may have a continuous or discontinuous shape. Also, each of the second insulation film 122A and the guide member 131 may have a top surface having an uneven structure.

The insulation film 123 may be connected to the first insulation film 122 attached to a top surface of an interface between the first and second metal layers 111 and 113.

The resin layer 162 is disposed on the inside portion of the first and second metal layers 111 and 113 to seal the light emitting chip 145. Here, the side parts 111D and 113D of the first and second metal layers 111 and 113 may prevent the resin layer 162 from overflowing. The resin layer 162 may be formed in a dispensing process or a transfer molding process, but is not limited thereto.

Figure 23:
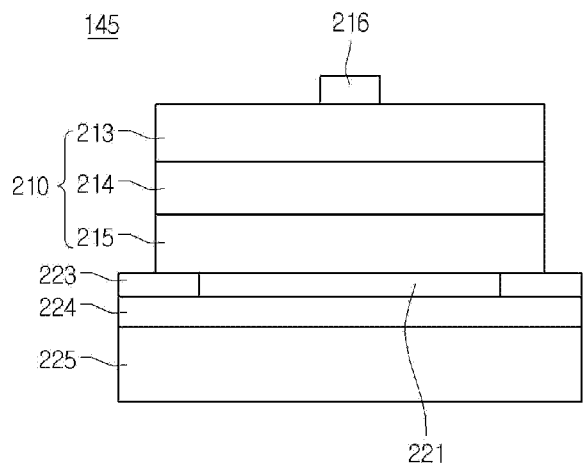

A concave portion 168 is defined in an upper center area of the resin layer 162. The concave portion 168 may be recessed toward the light emitting chip 145 on the light emitting chip 145. The concave portion 168 may have a downwardly tapered shape, e.g., a cone shape or a column shape. The concave portion 168 may have a maximum width thicker than a width of the light emitting chip 145. A predetermined reflective material 169 may be disposed in the concave portion 168 of the resin layer 162. The reflective material 169 may include a dispersion or diffusion agent such as $TiO_2$, or $SiO_2$. The reflective material 169 may reflect light incident into the concave portion 168 to prevent hot spots form occurring in distribution of light emitted from the light emitting device in a top view manner as shown in FIG. 23.

Figure 17:
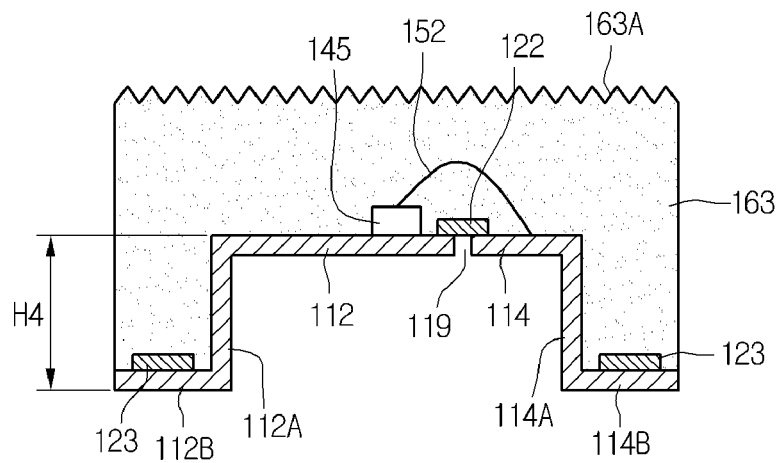
FIG. 17 is a side sectional view of a light emitting device according to an eighth embodiment.

FIG. 17 is a side sectional view of a light emitting device according to an eighth embodiment.

Referring to FIG. 17, a light emitting device has a structure in which outer parts of first and second metal layers 112 and 114 are stepped downward with respect to a surface on which the light emitting chip 145 is mounted.

The outer part of the first metal layer include a side part 112A which is vertically bent downward from an inside portion of the first metal layer 112, i.e., a portion at which the light emitting chip is mounted and a horizontal outer part 112B which is bent from the side part 112A outward. Since a side part 114A and outer part 114B of the second metal layer are symmetric to those 112A and 112B of the first metal layer 112, description of the side part 114A and outer part 114B of the second metal layer 114 will refer to the description of the first metal layer 112.

The outer part 112B of the first metal layer 112 and the outer part 114B of the second metal layer 114 are disposed parallelly with respect to a base part on which the light emitting chip 145 is mounted.

The side part 112A of the first metal layer 112 and the side part 114A of the second metal layer 114 are disposed corresponding to each other on a position lower than that of the light emitting chip 145.

The light emitting chip 145 is disposed on the inside portion of the first metal layer 112. Also, the light emitting chip 145 is connected to the inside portion of the second metal layer 114 through a wire.

A height difference H1 between the inside portions of the metal layers 112 and 114 may be thicker than a thickness of the light emitting chip 145. Since a space generated by the height difference H1 is provided under the light emitting chip 145, the thermal efficiency may be improved.

The outer parts 112B and 114B of the metal layers 112 and 114 may be bonding areas, respectively.

Here, the outer parts 112B and 114B of the metal layers 112 and 114 may be provided on both sides or all sides of the light emitting device. Thus, the attachment area of the second insulation film 123 may be changed according to shape of the outer parts 112B and 114B. For example, the first and second insulation films 122 and 123 may be attached along the side part 112A and the inside portion of the metal layers 112 and 114 and thus connected to each other.

Also, the outer parts of the first and second metal layers 112 and 114 may protrude upward from the outer parts 112B and 114B. Since a light blocking part is not provided around the light emitting chip 145, light emitted from the light emitting chip 145 may be radiated with orientation distribution of about 180°±10°.

The first insulation film 122 may be attached to the top surfaces of the first and second metal layers 112 and 114 corresponding to each other. The second insulation film 123 may be attached to the top surfaces of the outer parts 112B and 114B of the second metal layer 114. Thus, the first and second insulation films 122 and 123 may maintain an interval between the first and second metal layers and support the light emitting device.

The second insulation film 123 may have a ring or loop shape around the outer parts of the top surface of the plurality of metal layers 112 and 114. The second insulation film 113 may be connected to or separated from the first insulation film, but is not limited thereto.

The resin layer 163 is disposed on the first and second metal layers 111 and 113 to cover the light emitting chip 145 and the first and second insulation films 122 and 123. The resin layer 163 may be manufactured in a transfer molding process. Also, a pattern 163A having an uneven shape may be disposed on a surface of the resin layer 163.

Figure 18:
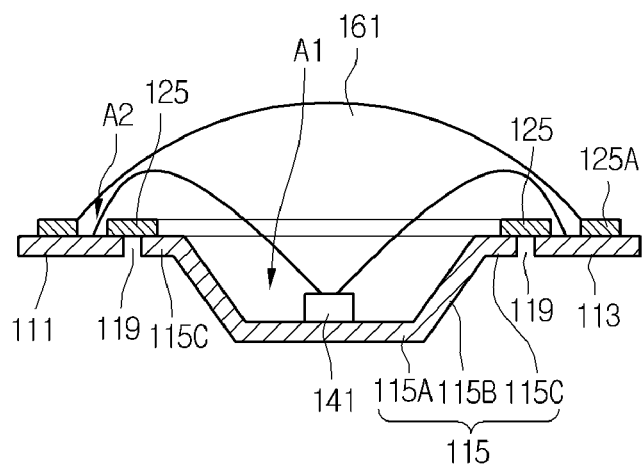
FIG. 18 is a side sectional view of a light emitting device according to a ninth embodiment.

FIG. 18 is a side sectional view of a light emitting device according to a ninth embodiment.

Referring to FIG. 18, a light emitting device includes three metal layers. The three metal layers include a third metal layer 115 that is a heatsink frame and first and second metal layers 111 and 113.

The third metal layer 115 has a cavity A1 in a center area thereof. The cavity may be defined by a side part 115B inclined from a flat base part 115A. The side part 115B may be disposed on both side surfaces or all side surfaces of the base part 115A. The side part 115B has an end including an outer part 115C which is horizontally disposed.

The outer part 115C disposed on both sides of the third metal layer 115 may correspond to the first and second metal layers 111 and 113, respectively.

The first insulation film 125 is attached to an area on which the outer part 115C of the third metal layer 115 and the first and second metal layers 111 and 113 correspond to each other. The second insulation film 125A may be attached around the top surfaces of the surroundings of the first and second metal layers 111 and 113 in a frame shape, a ring shape, or a loop shape. The second insulation film 125 A may be connected to the first insulation film 125. In this case, the second insulation film 125A may extend from the top surfaces of the first and second metal layers 111 and 113 to a top surface of the third metal layer 115.

The light emitting chip 141 is disposed on the base part 115A of the second metal layer 115. Also, the light emitting chip 141 may be disposed inside the cavity A1.

The first and second metal layers 111 and 113 are exposed through opened areas A2 between the first insulation film 125 and the second insulation film 125A, respectively. Opened areas A2 of the first and second metal layers 111 and 113 may be disposed on sides opposite to each other with respect to the cavity A1. The first and second metal layers 111 and 113 disposed on the opened areas A2 may be connected to the light emitting chip 141 through wires 151 and 152, respectively.

The resin layer 161 may be molded to seal the light emitting chip 141 and the wires 151 and 152. The resin layer 161 may have a convex surface, but is not limited thereto.

A guide member formed of a reflective material may be further disposed on the top surface of the second insulation film 125A. The guide member may have a ring shape, a frame shape, or a loop shape.

The light emitting device includes the third metal layer 115, which is a heatsink plate, protruding downward on the center side thereof. Also, the light emitting device includes the first and second metal layers 111 and 113 stepped upward from the third metal layer 115. Thus, a hole for receiving the third metal layer 115 may be further defined in a board (PCB) of a light emitting module to be bonded to the first and second metal layers 111 and 113.

Figure 19:
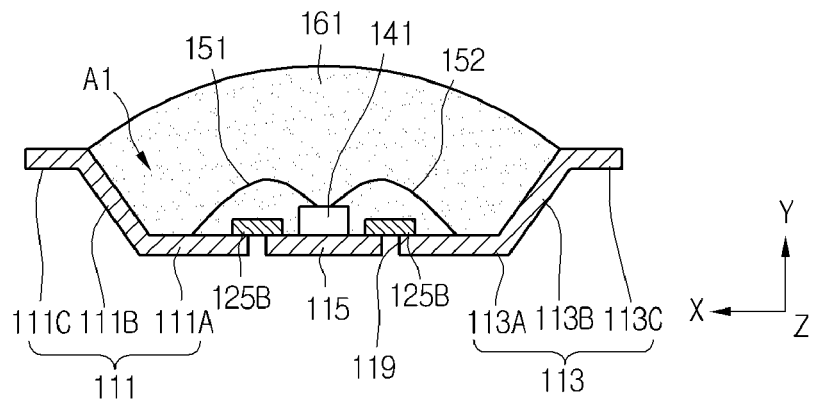
FIG. 19 is a sectional view of a light emitting device according to a tenth embodiment.
Figure 20:
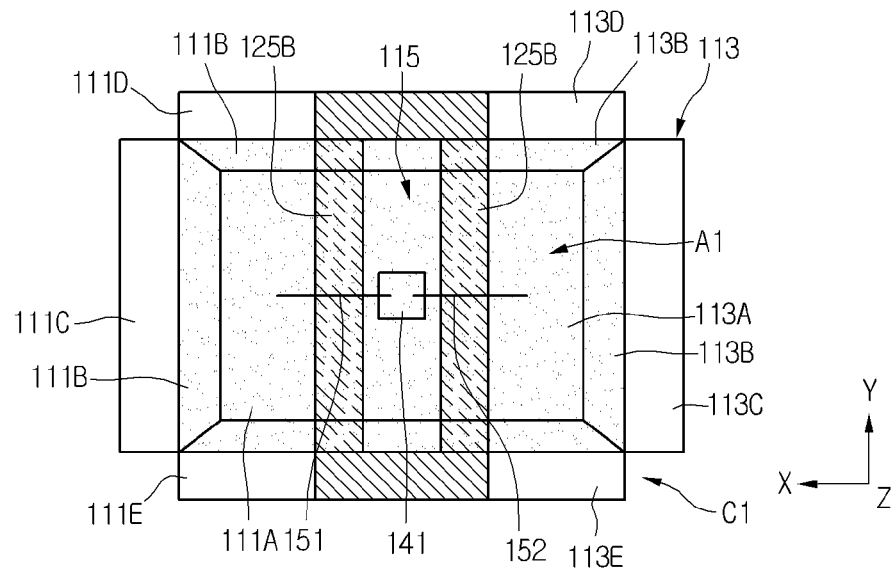
FIG. 20 is a plan view of the light emitting device of FIG. 19.

FIG. 19 is a side sectional view of a light emitting device according to a tenth embodiment. FIG. 20 is a plan view of the light emitting device of FIG. 19.

Referring to FIG. 19, a light emitting device has a cavity A1 by first to third metal layers 111, 113, and 115. The first and second metal layers 111 and 113 are disposed on both sides of the third metal layer 115 to correspond to each other. As shown in FIG. 20, base parts 111A and 113A, side parts 111B, and 113B, and outer parts 111C and 113C of the first and second metal layers 111 and 113 are disposed on both sides of the third metal layer 115. The third metal layer 115 may correspond to the first and second metal layers 111 and 113 along a Z-axis direction.

The base parts 111A and 113A of the first and second metal layers 111 and 113 may flush with a top surface of the third metal layer 115.

An insulation film 125b is disposed on a top surface between the third metal layer 115 and the first and second metal layers 111 and 113. As shown in FIG. 20, the insulation film 125B may extend up to the outer parts 111C and 113C of the first and second metal layers 111 and 113 arranged in the Z-axis direction and have a ring shape.

The light emitting chip 141 is mounted on the third metal layer 115. Also, the third metal layer 115 is connected to the first and second metal layers 111 and 113 through the wires 151 and 152. The structure shown in FIG. 19 may be applied to the structure shown in FIGS. 12 and 14 and thus may provide a light blocking part.

As shown in FIG. 20, the outer parts 111C and 113C of the first and second metal layers 111 and 113 may be separately disposed in each direction, e.g., an X-axis and Z-axis directions. Thus, a cut area C1 may be disposed between the outer parts 111c and 113C of the first and second metal layers 111 and 113.

Figure 21:
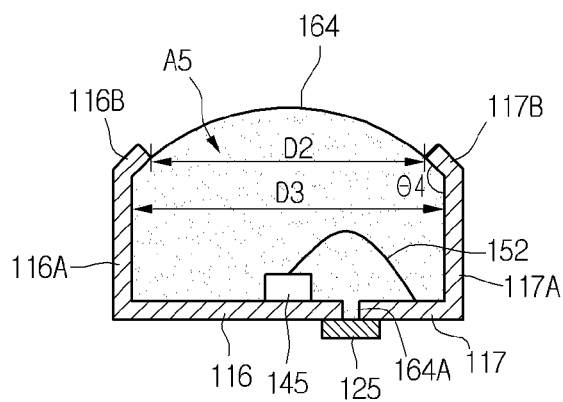
FIG. 21 is a side sectional view of a light emitting device according to an eleventh embodiment.

FIG. 21 is a side sectional view of a light emitting device according to an eleventh embodiment.

Referring to FIG. 21, first and second metal layers 116 and 117 of a light emitting device may include light blocking parts 116A and 117A, respectively. The light blocking parts 116A and 117A may be bent vertically with respect to a surface on which the light emitting chip 145 is mounted and are disposed to face each other. The light blocking parts 116A and 117A may have upper ends 116B and 117B which are bent at a predetermined angle θ4 in an inner area A5. The upper ends 116B and 117B of the light blocking parts 116A and 117A may have an interior angle θ4 of about 100° to about 170°.

Thus, since an interval D2 between the upper ends 116B and 117B is less than an interval D3 between the light blocking parts 116A and 117A, light emitted from the light emitting chip 145 may be emitted onto a surface of the resin layer 164 through the area A5 between the upper ends 116B and 117B.

The light emitting device may concentrate orientation distribution of the light emitted from the light emitting chip 145 into a center. In this case, the orientation distribution may be changed in a shape of the surface of the resin layer 164. The resin layer 164 may have a hemisphere shape or a flat shape. Alternatively, the resin layer 164 may have a shape with a rough structure.

A portion 164A of the resin layer 164 may be filled between the first and second metal layer 116 and 117. The portion 164A of the resin layer 164 may be disposed on a surface on which the first and second metal layers 116 and 117 correspond to each other to fix the first and second metal layers 116 and 117.

An insulation film 125 is attached to a lower surface between the first and second metal layers 116 and 117. The insulation film 125 may be temporarily attached to the lower surfaces of the first and second metal layers 116 and 117, and then may be removed after the resin layer 164 is formed, but are not limited thereto.

Features of each embodiment may be selectively applied to other embodiments, are not limited to each embodiment.

<Light Emitting Chip>

A light emitting chip according to an embodiment will be described with reference to FIGS. 22 and 23.

Figure 22:
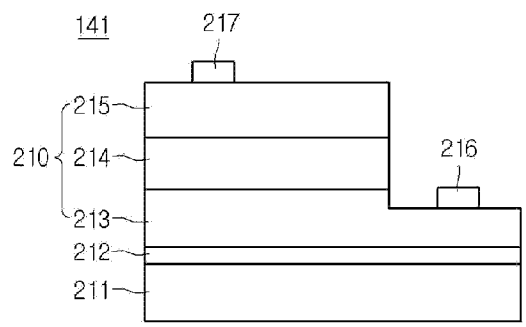
FIGS. 22 and 23 are views illustrating an example of a light emitting chip according to an embodiment.

Referring to FIG. 22, a light emitting chip 141 may include a substrate 211, a buffer layer 212, a first conductive type semiconductor layer 213, an active layer 214, a second conductive type semiconductor layer 215, a first electrode 216, and a second electrode 217. The first conductive type semiconductor layer 213, the active layer 214, and the second conductive type semiconductor layer 215 may be defined as a light emitting structure 210.

The substrate 211 may be formed of $Al_2O_3$, GaN, SiC, ZnO, Si, GaP, InP, $Ga_2O_3$, a conductive substrate, and GaAs. The substrate 211 may be a growth substrate. A semiconductor having the compositional formula of $In_xAl_yGa_{1-x-y}N$ ($0 \leq x \leq 1$, $0 \leq y \leq 1$, $0 \leq x+y \leq 1$) may be grown on the growth substrate.

The buffer layer 212 may a layer for reducing a lattice constant difference between the substrate 211 and the semiconductor and may be formed of a group II to VI compound semiconductor. An undoped Group III-V compound semiconductor layer may be further disposed on the buffer layer 212, but is not limited thereto.

The first conductive type semiconductor layer 212 is disposed on the buffer layer 213, the active layer 224 is disposed on the first conductive type semiconductor layer 213, and the second conductive layer 215 is disposed on the active layer 224.

The first conductive type semiconductor layer 213 may be formed of a group III-V compound semiconductor in which a first conductive type dopant is doped, e.g., one of GaN, AlN, AlGaN, InGaN, InN, InAlGaN, AlInN, AlGaAs, GaP, GaAs, GaAsP, and AlGaInP. When the first conductive type semiconductor layer is an N-type semiconductor layer, the first conductive type dopant may include an N-type dopant such as Si, Ge, Sn, Se, and Te. The second conductive type semiconductor layer 214 may be formed as a single layer or a multi layer, but is not limited thereto.

The active layer 214 may have one of a single quantum well structure, a multi quantum well (MQW) structure, a quantum wire structure, and a quantum dot structure. The active layer 214 may have a cycle of a well layer and a barrier layer, e.g., an InGaN well layer/GaN barrier layer or a cycle of an InGaN well layer/AlGaN barrier layer using the group III-V compound semiconductor material.

A conductive type clad layer may be disposed above or/and under the active layer 214. The conductive type clad layer may be formed of an AlGaN-based semiconductor.

A second conductive type is formed on the active layer 214. The second conductive semiconductor layer 215 may be formed of a group III-V compound semiconductor in which a second conductive type dopant is doped, e.g., one of GaN, AlN, AlGaN, InGaN, InN, InAlGaN, AlInN, AlGaAs, GaP, GaAs, GaAsP, and AlGaInP. When the second conductive type semiconductor layer is a P-type semiconductor layer, the second conductive type dopant may include a P-type dopant such as Mg and Ze. The second conductive type semiconductor layer 215 may have a single or multi-layered structure, but is not limited thereto.

A third conductive type semiconductor layer, e.g., an N-type semiconductor layer may be disposed on the second conductive type semiconductor layer 215. Thus, the light emitting structure 235 may have at least one of an N-P junction structure, a P-N junction structure, an N-P-N junction structure, and a P-N-P junction structure.

A current spreading layer may be disposed on the second conductive type semiconductor layer 215. The current spreading layer may be formed of one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO).

A first electrode 216 may be disposed on the first conductive type semiconductor layer 213 and a second electrode 217 may be disposed on the second conductive type semiconductor layer 215.

The first electrode 216 and the second electrode 217 may be connected to the metal layers of FIG. 1 or 5 through a wire.

FIG. 23 is a view of a vertical type chip structure.

Referring to FIG. 23, a light emitting chip 145 includes an ohmic layer 221 under a light emitting structure 210, a reflective layer 224 under the ohmic layer 221, a conductive supporting member 224 under the reflective layer 225, and a protective layer 224 around the reflective layer 223 and the light emitting structure 210.

The light emitting device 145 may be formed by forming an ohmic layer 221, a channel layer 223, a reflective layer 225, and a conductive supporting member 225 on the second conductive type semiconductor layer 215 and then removing the substrate 211 and the buffer layer 213 without performing an etching process for exposing the first conductive type semiconductor layer 213 in the structure of FIG. 22.

The ohmic layer 221 may ohmic-contact a lower layer of the light emitting structure 210, for example, the second conductive type semiconductor layer. The ohmic layer 221 may be formed of one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au, Hf and combinations thereof. Also, the ohmic layer 121 may be formed as a multi layer using the metal material and a light-transmitting conductive material such as IZO, IZTO, IAZO, IGZO, IGTO, AZO, and ATO. For example, the multi layer may include IZO/Ni, AZO/Ag, IZO/Ag/Ni, and AZO/Ag/Ni. A layer for blocking current corresponding to the electrode 216 may be further disposed within the ohmic layer 221.

The protective layer 223 may be formed of one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $SiO_x$, $SiO_xN_y$, $Si_3N_4$, $Al_2O_3$, and $TiO_2$. The protective layer 223 may be formed through a sputtering method or a deposition method. The protective layer 224 may prevent the layers of the light emitting structure 210 from being electrically short-circuited with each other.

The reflective layer 224 may be formed of one of Ag, Ni, Al, Rh, Pd, Ir, Ru, Mg, Zn, Pt, Au, Hf, and combinations thereof. The reflective layer 224 may have a width wider than that of the light emitting structure 210 to improve light reflection efficiency.

For example, the conductive support member 225 may serve as a base substrate. The conductive support member 125 may be formed of at least one of copper (Cu), gold (Au), nickel (Ni), molybdenum (Mo), copper-tungsten (Cu—W), and carrier wafers (e.g., Si, Ge, GaAs, ZnO, Sic, etc). An adhesion layer may be further disposed between the conductive support member 225 and the reflective layer 224. Thus, the two layers may adhere to each other by the adhesion layer.

The above-disclosed light emitting chip of FIGS. 22 and 23 is just one example and is not limited to the above features. The light emitting chip may be selectively applied to the embodiments of the light emitting device, but is not limited thereto.

<Lighting System>

The light emitting device of the above disclosed embodiments has a structure in which the light emitting chip is packaged. Also, a plurality of light emitting devices may be disposed on a board, and thus provided to a lighting system such as a light emitting module or a light unit. One of the light emitting devices according to the above embodiments may be applied to the lighting system.

The light emitting device according to the embodiment may be applied to the light unit. The light unit may have a structure in which a plurality of light emitting devices are arrayed. The light unit may include the display device illustrated in FIGS. 24 and 25 and the lighting device illustrated in FIG. 26. Furthermore, the light unit may include illumination lamps, traffic lights, vehicle headlights, and signs.

FIG. 24 is an exploded perspective view illustrating a display device according to an embodiment.

Referring to FIG. 24, a display unit 1000 may include a light guide plate 1041, a light emitting module 1031 providing light to the light guide plate 1041, a reflective member 1022 under the light guide plate 1041, an optical sheet 1051 above the light guide plate 1041, a display panel 1061 above the optical sheet 1051, and a bottom cover 1011 receiving the light guide plate 1031, the light emitting module 1031, and the reflective member 1022, but is not limited thereto.

The bottom cover 1011, the reflective member 1022, the light guide plate 1041, and the optical sheet 1051 may be defined as the light unit 1050.

The light guide plate 1041 diffuses light to produce planar light. For example, the light guide plate 1041 may be formed of a transparent material, e.g., one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 is disposed to provide light to the at least one lateral surface of the light guide plate 1041. Thus, the light emitting module 1031 may be used as a light source of a display device.

At least one light emitting module 1031 may be disposed on one lateral surface of the light guide plate 1041 to directly or indirectly provide light. The light emitting module 1031 may include a board 1033 and the light emitting devices 100 according to the embodiment. Also, the light emitting devices 100 may be arrayed on the board 1033 with a predetermined interval.

The board 1033 may be a printed circuit board (PCB) including a circuit pattern. The board 1033 may include a metal core PCB (MCPCB) or a flexible PCB (FPCB) as well as a general PCB, but is not limited thereto. When the light emitting device 100 are mounted on a lateral surface of the bottom cover 1011 or on a heatsink plate, the substrate 1033 may be removed. Here, a portion of the heatsink plate may contact a top surface of the bottom cover 1011.

The plurality of light emitting devices 100 may be mounted on the substrate 1033 to allow a light emission surface through which light is emitted to be spaced a predetermined interval from the light guide plate 1041, but is not limited thereto. The light emitting device 100 may directly or indirectly provide light to a light incident surface that is a side surface of the light guide plate 1041, but is not limited thereto.

The reflective member 1022 may be disposed below the light guide plate 1041. Since the reflective member 1022 reflects light incident onto an under surface of the light guide plate 1041 to supply the light upward, brightness of the light unit 1050 may be improved. For example, the reflective member 1022 may be formed of one of PET, PC, and PVC, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may include a receiving part 1012 having a box shape with an opened upper side, but is not limited thereto. The bottom cover 1011 may be coupled to a top cover (not shown), but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel, and include first and second substrates formed of a transparent material and a liquid crystal layer between the first and second substrates. A polarizing plate may be attached to at least one surface of the display panel 1061. The present disclosure is not limited to the attached structure of the polarizing plate. The display panel 1061 may display information using light emitted from the light emitting module 1051. The display unit 1000 may be applied to various portable terminals, a monitor for a notebook computer, a monitor for a laptop computer, television, etc.

The optical sheet 1051 is disposed between the display panel 1061 and the light guide plate 1041 and includes at least one transmission sheet. For example, the optical sheet 1051 may include at least one of a diffusion sheet, a horizontal or vertical prism sheet, a brightness enhanced sheet, etc. The diffusion sheet diffuses incident light, and the horizontal or/and vertical prism sheet collects the incident light into a display region. In addition, the brightness enhanced sheet reuses lost light to improve the brightness. Also, a protection sheet may be disposed on the display panel 1061, but is not limited thereto.

Here, optical members such as the light guide plate 1041 and the optical sheet 1051 may be disposed on an optical path of the light emitting module 1031, but is not limited thereto.

Figure 25:
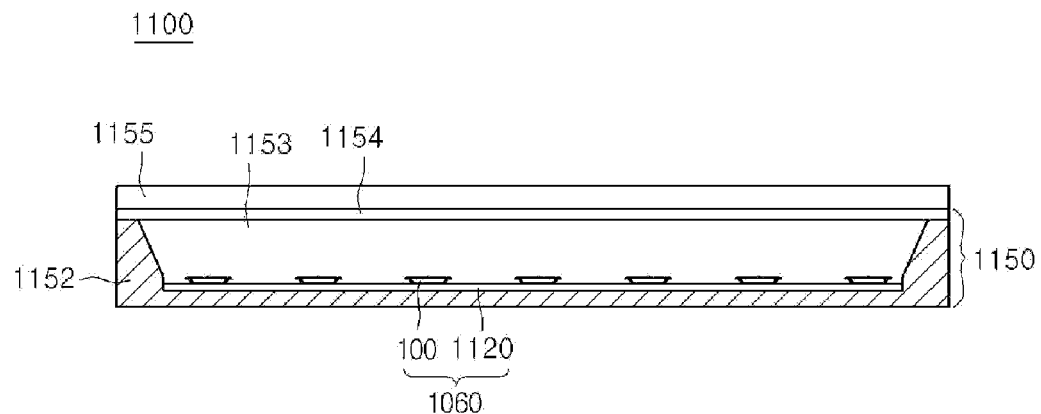
FIG. 25 is a perspective view illustrating another example of the display device according to an embodiment.

FIG. 25 is a view of a display device according to an embodiment.

Referring to FIG. 25, a display apparatus 1100 includes a bottom cover 1152, a board 1120 on which the light emitting devices 100 described above are arrayed, an optical member 1154, and a display panel 1155.

The substrate 1120 and the light emitting device 100 may be defined as a light emitting module 1060. The bottom cover 1152, at least one light emitting module 1060, the optical member 1154 may be defined as the light unit.

The bottom cover 1152 may include a receiving part 1153, but is not limited thereto.

Here, the optical member 1154 may include at least one of a lens, a light guide plate, a diffusion sheet, horizontal and vertical prism sheets, and a bright enhancement sheet. The light guide plate may be formed of a PC material or PMMA material. In this case, the light guide plate may be removed. The diffusion sheet diffuses incident light, and the horizontal and vertical prism sheets collect the incident light into the display panel 1155. The brightness enhanced sheet reuses lost light to improve brightness.

The optical member 1154 is disposed on the light emitting module 1060 to produce planar light using the light emitted from the light emitting module 1060 or diffuse and collect the light emitted from the light emitting module 1060.

Figure 26:
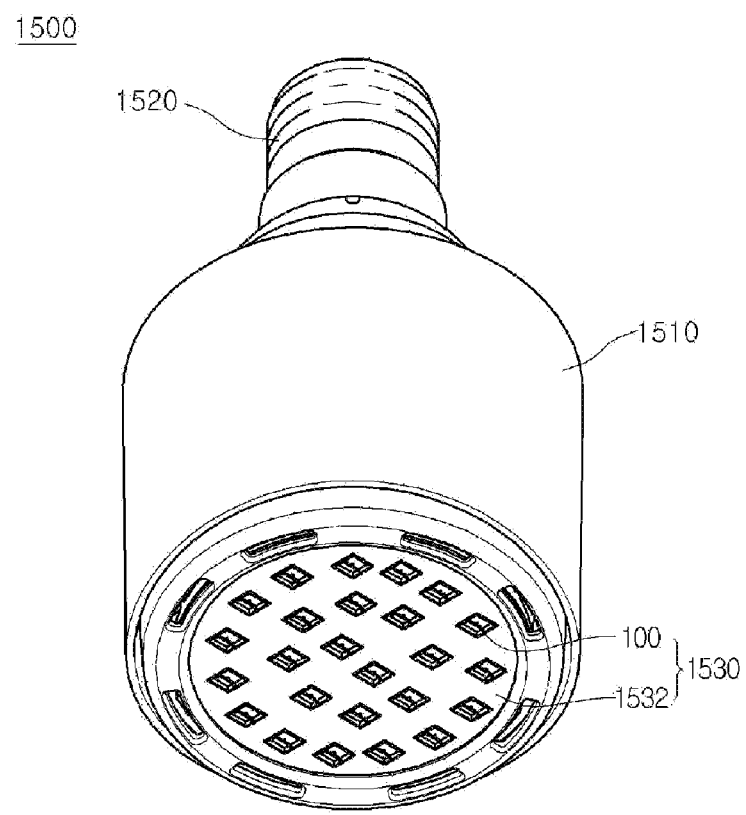
FIG. 26 is a perspective view of a lighting unit according to an embodiment.

FIG. 26 is a perspective view of a lighting device according to an embodiment.

Referring to FIG. 26, the lighting unit 1500 may include a case 1510, a light emitting module 1530 disposed in the case 1510, and a connection terminal 1520 disposed in the case 1510 to receive an electric power from an external power source.

The case body 1510 may be formed of a material having good thermal dissipation properties, e.g., a metal material or a resin material.

The light emitting module 1530 may include a board 1532 and a light emitting device 100 mounted on the board 1532. The light emitting device 100 may be provided in plurality, and the plurality of light emitting devices 200 may be arrayed in a matrix shape or spaced a predetermined interval from each other.

A circuit pattern may be printed on a dielectric to manufacture the board 1532. For example, the board 1532 may include a printed circuit board (PCB), a metal core PCB, a flexible PCB, a ceramic PCB, or a FR-4.

Also, the board 1532 may be formed of a material which may effectively reflect light or be coated with a color by which light is effectively reflected, e.g., a white color or a silver color.

At least one light emitting device 100 may be disposed on the board 1532. The light emitting device 100 may include at least one light emitting diode (LED) chip. The LED may include color LEDs, which respectively emit light having a red color, a green color, a blue color, and a white color and an ultraviolet (UV) LED emitting UV.

The light emitting module 1530 may have combinations of several light emitting devices 100 to obtain desired color and luminance. For example, the white LED, the red LED, and the green LED may be combined with each other to secure a high color rendering index.

The connection terminal 1520 may be electrically connected to the light emitting module 1530 to supply a power. The connection terminal 1520 may be screwed and coupled to an external power source in a socket type, but is not limited thereto. For example, the connection terminal 1520 may have a pin shape, and thus, be inserted into the external power source. Alternatively, the connection terminal 1220 may be connected to the external power source by a wire.

Embodiments may provide a tape type or film type light emitting device. In the embodiments, since the metal layer is supported by the insulation film without using the package body, the manufacturing process of the light emitting device may be improved. Furthermore, the light emitting device may be reduced in thickness. According to the embodiments, the metal layer including the concave cavity or the light blocking part may be provided to improve light extraction efficiency of the light emitting device.

According to the embodiments the reliability of the light emitting device may be improved. Also, the miniaturization and integration of the light emitting device may be improved. According to the embodiments, the thermal efficiency may be improved in the light emitting device and a lighting system having the same.

Features, structures, and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure.

Although embodiments have been described with reference to illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

What is claimed is:

1. A light emitting device comprising:
   a plurality of metal layers comprising first and second metal layers spaced from each other;
   a first insulation film disposed on a top surface of the plurality of metal layers, the first insulation film having a width wider than an interval between the plurality of metal layers, the first insulation film bridging a space between the first and second metal layers and not being in between the first and second metal layers;
   a second insulation film connected to the first insulation film around top surfaces of the plurality of metal layers, the second insulation film having an opened area in which portions of a top surface area of the plurality of metal layers are opened;
   a guide member disposed on the second insulation film;
   a semiconductor light emitting chip disposed on at least one of the plurality of metal layers, the semiconductor light emitting chip being electrically connected to the first and second metal layers; and
   a resin layer disposed within the guide member,
   wherein each of inside portions of the plurality of metal layers has a cavity having a depth less than that of each of outer portions of the plurality of metal layers.

2. The light emitting device according to claim 1, further comprising a concave portion recessed from a top surface of the resin layer in a direction of the light emitting chip and a reflective material disposed in the concave portion.

3. The light emitting device according to claim 1, wherein the guide member is formed of at least one of solder resist, solder paste, Ag, Al, Cu, Au, Ag-alloy, Al-alloy, Cu-Alloy, and Au-alloy.

4. A light emitting device comprising:
   a plurality of metal layers comprising first and second metal layers spaced from each other;
   a first insulation film disposed on a top surface of the first and second metal layers, the first insulation film having a width wider than a space between the first and second metal layers;
   a second insulation film disposed around top surfaces of the first and second metal layers, the second insulation film being connected to the first insulation film;
   a semiconductor light emitting chip disposed on at least one of the first and second metal layers, the semiconductor light emitting chip being electrically connected to the first and second metal layers; and
   a resin layer disposed on the first and second metal layers and the semiconductor light emitting chip,
   wherein the first metal layer comprises a first base part and a first side part bent and angled from the first base part on an outer portion of the first base part so as to form a cavity,
   wherein the second metal layer comprises a second base part corresponding to the first base part of the first metal layer and a second side part bent and angled from the second base part on an outer portion of the second base part to correspond to the first side part so as to form the cavity with the space between the first and second metal layers within an interior of the cavity, and
   wherein the first insulation film includes a first insulation base part corresponding to the first and second based parts and includes first insulation side parts corresponding to the bent and angled first and second side parts of the first and second metal layers.

5. The light emitting device according to claim 4, wherein the cavity is formed in an inside portion of the first and second metal layers.

6. The light emitting device according to claim 4, wherein the plurality of metal layers further comprise a third metal layer between the first metal layer and the second metal layer, and the light emitting chip is disposed on the third metal layer and connected to the first and second metal layers through a wire.

7. The light emitting device according to claim 4, wherein the first insulation film comprises at least one of a polyimide (PI) film, a polyethylene terephthalate (PET) film, an ethylene vinyl acetate (EVA) film, a polyethylene naphthalate (PEN) film, a triacetyl cellulose (TAC) film, a polyamide imide (PAI) film, a polyether ether ketone (PEEK) film, a perfluoroalkoxy (PFA) film, a polyphenylene sulfide (PPS) film, and a resin film.

8. The light emitting device according to claim 6, wherein the cavity is formed in an inside portion of the third metal layer.

9. The light emitting device according to claim 6, wherein the cavity is disposed in an inside portion of the first to third metal layers.

10. A light emitting device comprising:
    a plurality of metal layers comprising first and second metal layers spaced from each other;

a first insulation film disposed on a top surface of the first and second metal layers, the first insulation film having a width wider than a space between the first and second metal layers;

a semiconductor light emitting chip disposed on the first metal layer;

a resin layer disposed on the first metal layer, the first insulation film, and the semiconductor light emitting chip, wherein the first metal layer comprises a first base part having the semiconductor light emitting chip disposed thereon and a first side part bent and angled from the first base part on an outer portion of the first base part so as to form a cavity, wherein the second metal layer comprises a second base part corresponding to the first base part of the first metal layer and a second side part bent and angled from the second base part on an outer portion of the second base part to correspond to the first side part so as to form the cavity with the space between the first and second metal layers within an interior of the cavity, and wherein the first insulation film includes a first insulation base part corresponding to the first and second based parts and includes first insulation side parts corresponding to the bent and angled first and second side parts of the first and second metal layers; and a second insulation film disposed on a periphery of top surfaces of the first base part of the first metal layer and the second base part of the second metal layer, the second insulation film having an opened area therein, wherein the second insulation film is connected to the first insulation film.

11. The light emitting device according to claim 10, wherein at least one of the first side part of the first metal layer and/or the second side part of the second metal layer is disposed around the light emitting chip.

12. The light emitting device according to claim 10, further comprising:

a first outer part bent from the first side part of the first metal layer; and a second outer part bent from the second side part of the second metal layer, wherein the first and second outer parts are disposed parallel to an extending line of the first and second base parts.

13. The light emitting device according to claim 10, further comprising:

a guide member protruding in a thickness direction of the second insulation film on the second insulation film.

14. The light emitting device according to claim 13, wherein the guide member is formed of a resin material or a metallic material.

15. A light emitting device comprising:

a plurality of metal layers comprising first and second metal layers spaced from each other;

a first insulation film disposed on a top surface of the plurality of metal layers, the first insulation film having a width wider than an interval between the plurality of metal layers;

a semiconductor light emitting chip disposed on the first metal layer of the plurality of metal layers; and a resin layer disposed on the first metal layer, the first insulation film, and the semiconductor light emitting chip, wherein the first metal layer comprises a first base part disposed on the semiconductor light emitting chip and a first side part bent from the first base part on an outer portion of the first base part, and wherein a portion of at least one of the first side part of the first metal layer and the second side part of the second metal layer is disposed at a position higher than a top surface of the resin layer.

16. A light emitting device comprising:

a plurality of metal layers comprising first and second metal layers spaced from each other;

a first insulation film disposed on a top surface of the first and second metal layers, the first insulation film having a width wider than a space between the first and second metal layers;

a semiconductor light emitting chip disposed on the first metal layer; and a resin layer disposed on the first metal layer, the first insulation film, and the semiconductor light emitting chip, wherein the first metal layer comprises a first base part having the semiconductor light emitting chip disposed thereon and a first side part bent and angled from the first base part on an outer portion of the first base part so as to form a cavity, wherein the second metal layer comprises a second base part corresponding to the first base part of the first metal layer and a second side part bent and angled from the second based part on an outer portion of the second base part to correspond to the first side part so as to form the cavity with the space between the first and second metal layers within an interior of the cavity, wherein the first insulation film includes a first insulation base part corresponding to the first and second based parts and includes first insulation side parts corresponding to the bent and angled first and second side parts of the first and second metal layers, and wherein the first side part of the first metal layer and the second side part of the second metal layer are disposed to a lower area than that of the light emitting chip.

* * * * *